US012696654B2

(12) United States Patent
Li et al.

(10) Patent No.: US 12,696,654 B2
(45) Date of Patent: Jul. 28, 2026

(54) LIGHT-EMITTING SUBSTRATE, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Langtao Li, Beijing (CN); Kening Zheng, Beijing (CN); Jian Xu, Beijing (CN); Zhen Hu, Beijing (CN); Han Wu, Beijing (CN); Jinglu Bai, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 363 days.

(21) Appl. No.: 18/553,771

(22) PCT Filed: Dec. 1, 2022

(86) PCT No.: PCT/CN2022/135777
§ 371 (c)(1),
(2) Date: Oct. 3, 2023

(87) PCT Pub. No.: WO2024/113296
PCT Pub. Date: Jun. 6, 2024

(65) Prior Publication Data
US 2025/0081804 A1      Mar. 6, 2025

(51) Int. Cl.
*H10K 59/80* (2023.01)
*H10K 59/131* (2023.01)

(52) U.S. Cl.
CPC ..... *H10K 59/80515* (2023.02); *H10K 59/131* (2023.02); *H10K 59/80516* (2023.02)

(58) Field of Classification Search
CPC ........... H10K 59/80515; H10K 59/131; H10K 59/80516; H10K 59/122; H10K 59/124; H10K 59/12; H10K 59/80522
See application file for complete search history.

(56) References Cited

U.S. PATENT DOCUMENTS 9,871,090 B2 *   1/2018  Lee .................. H10K 59/80522
10,446,613 B2 *  10/2019 Lee ...................... H10K 71/621
(Continued)

FOREIGN PATENT DOCUMENTS

CN      102163617 A      8/2011
CN      105742324 A      7/2016
(Continued)

*Primary Examiner* — Jarrett J Stark
(74) *Attorney, Agent, or Firm* — DINSMORE & SHOHL LLP

(57) ABSTRACT

A light-emitting substrate, a display panel and a display device are disclosed. The light-emitting substrate includes: a base substrate; a first power line disposed on the base substrate; an auxiliary electrode pattern disposed on a side of the first power supply line away from the base substrate and electrically connected with the first power supply line; an organic material layer disposed on a surface of the auxiliary electrode pattern and having a first via hole exposing part of a surface of the auxiliary electrode pattern at the bottom, wherein the part of the surface of the auxiliary electrode pattern exposed at the bottom of the first via hole is a non-planar surface; and a first electrode layer disposed on a side of the organic material layer away from the base substrate and electrically connected with the auxiliary electrode pattern through the first via hole.

18 Claims, 12 Drawing Sheets

(56) References Cited

U.S. PATENT DOCUMENTS

| | | | | |
|---|---|---|---|---|
| 12,075,644 | B2 * | 8/2024 | Wang | H10K 59/1315 |
| 2005/0073243 | A1 * | 4/2005 | Yamazaki | H10K 50/824 |
| | | | | 313/498 |
| 2011/0198596 | A1 | 8/2011 | Park | |
| 2015/0380676 | A1 * | 12/2015 | Choi | H10K 71/231 |
| | | | | 438/23 |
| 2016/0190225 | A1 | 6/2016 | Kim et al. | |
| 2017/0110530 | A1 * | 4/2017 | Lee | H10K 50/824 |
| 2018/0158878 | A1 * | 6/2018 | Lee | H10D 86/0221 |
| 2018/0261797 | A1 | 9/2018 | Lee | |
| 2019/0115403 | A1 | 4/2019 | Kang | |
| 2021/0257581 | A1 | 8/2021 | Wang et al. | |
| 2023/0200128 | A1 | 6/2023 | Su et al. | |
| 2024/0172525 | A1 * | 5/2024 | Zhang | H10K 59/1201 |

FOREIGN PATENT DOCUMENTS

| | | | |
|---|---|---|---|
| CN | 106803544 | A | 6/2017 |
| CN | 107068727 | A | 8/2017 |
| CN | 108172597 | A | 6/2018 |
| CN | 109136834 | A | 1/2019 |
| CN | 109671739 | A | 4/2019 |
| CN | 110085648 | A | 8/2019 |
| CN | 112952023 | A | 6/2021 |
| CN | 113241367 | A | 8/2021 |
| CN | 114050174 | A | 2/2022 |
| CN | 216054713 | U | 3/2022 |
| CN | 115241399 | A | 10/2022 |
| CN | 115280537 | A | 11/2022 |
| EP | 3163626 | B1 | 12/2021 |
| JP | 2015050051 | A | 3/2015 |
| KR | 1020140080231 | A | 6/2014 |
| KR | 1020170080756 | A | 7/2017 |

* cited by examiner

A-A

DP

CF1  CCP1          CF2  CCP2          CF3 TP

BM
CAP1
PW
CAP2
ENL3
ENL2  TFE
ENL1
PDL
INL
SUB1

CS

LS

AE1 OL CE    T1    AE2 OL CE    T2    AE3 OL CE    T3

LD1              LD2              LD3

LS 90          3          902    901    903    B      B

A                                      NA x
y

A1  A2  A1  A2  A1  A2  A1  A2  A1  A2  A1  A2

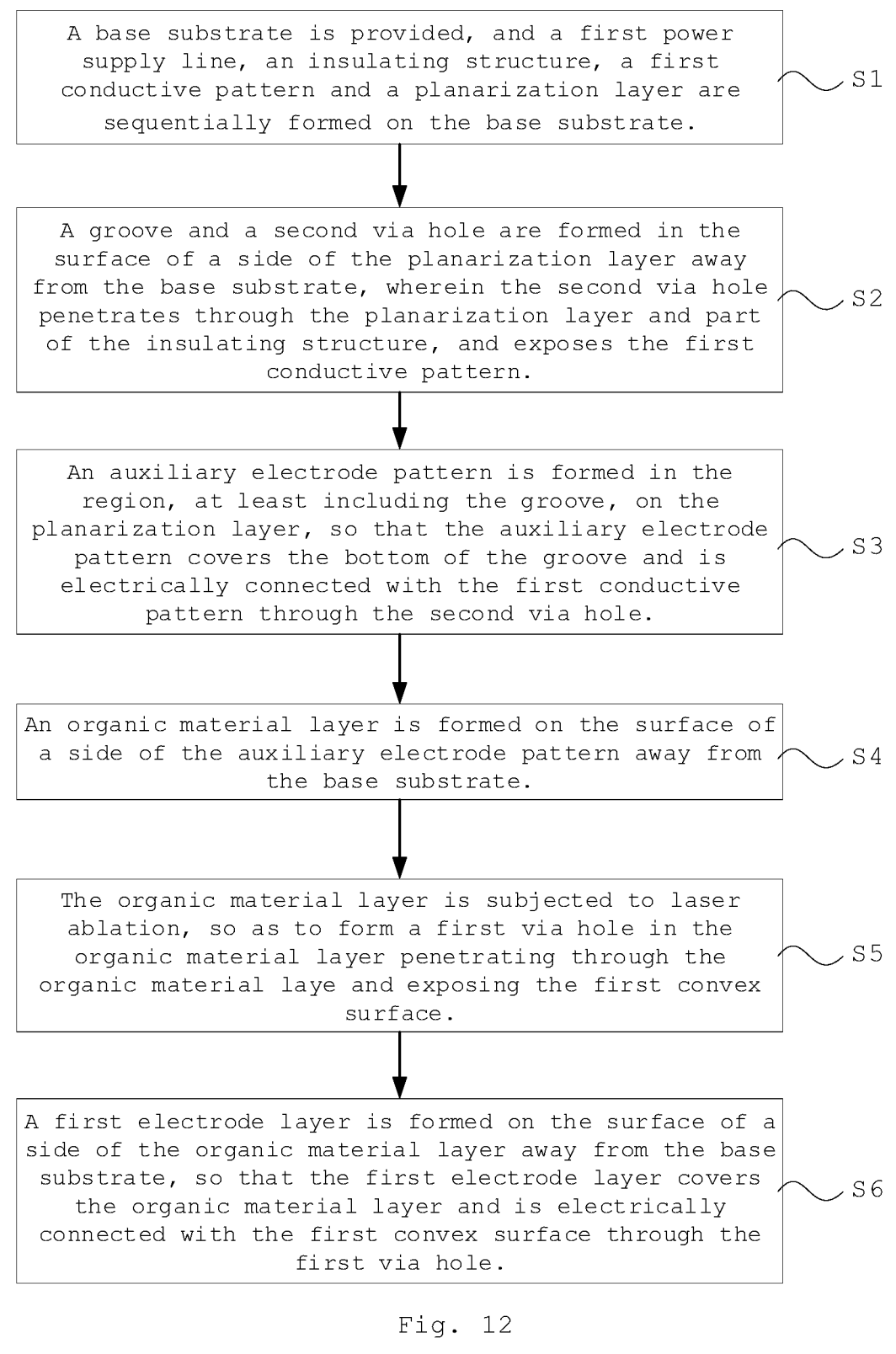

A base substrate is provided, and a first power supply line, an insulating structure, a first conductive pattern and a planarization layer are sequentially formed on the base substrate. ~ S1

↓

A groove and a second via hole are formed in the surface of a side of the planarization layer away from the base substrate, wherein the second via hole penetrates through the planarization layer and part of the insulating structure, and exposes the first conductive pattern. ~ S2

↓

An auxiliary electrode pattern is formed in the region, at least including the groove, on the planarization layer, so that the auxiliary electrode pattern covers the bottom of the groove and is electrically connected with the first conductive pattern through the second via hole. ~ S3

↓

An organic material layer is formed on the surface of a side of the auxiliary electrode pattern away from the base substrate. ~ S4

↓

The organic material layer is subjected to laser ablation, so as to form a first via hole in the organic material layer penetrating through the organic material laye and exposing the first convex surface. ~ S5

↓

A first electrode layer is formed on the surface of a side of the organic material layer away from the base substrate, so that the first electrode layer covers the organic material layer and is electrically connected with the first convex surface through the first via hole. ~ S6

Fig. 12

LIGHT-EMITTING SUBSTRATE, DISPLAY PANEL AND DISPLAY DEVICE

CROSS-REFERENCE TO RELATED APPLICATIONS

The present application is a U. S. National Stage Application under 35 U.S.C. § 371 of International Patent Application No. PCT/CN2022/135777, filed on Dec. 1, 2022, the disclosure of which is incorporated by reference herein in its entirety.

TECHNICAL FIELD

The present disclosure relates to the field of display technologies, in particular to a light-emitting substrate, a display panel and a display device.

BACKGROUND

Recently, light-emitting diode displays have been widely used as self-luminous display devices. Unlike a liquid crystal display, the light-emitting diode display device has a self-emission characteristic, and thus may not include a separate light source, so that the thickness and weight thereof can be reduced. In addition, the light-emitting diode display device has various desirable characteristics, such as low power consumption, high brightness and fast response speed. Generally, the light-emitting diode display device usually includes a plurality of transistors and a plurality of light-emitting elements. In such a light-emitting diode display device, the transistors are connected to a signal line, and a driving current may be transmitted to the light-emitting elements. The transistor may include an active pattern containing a channel region and a conductive region.

With the development of display technologies, the display device can display images with high resolution, such as an ultra-high definition (UHD) resolution. In the case of the high-resolution display device, with the increase of the number of pixels, a driving voltage applied to the pixels may be uneven, resulting in differences in a display picture to reduce a viewing quality.

SUMMARY

In one aspect of the present disclosure, a light-emitting substrate is provided and includes:

a base substrate;

a first power supply line disposed on the base substrate;

an auxiliary electrode pattern disposed on a side of the first power supply line away from the base substrate and electrically connected with the first power supply line;

an organic material layer disposed on a surface of a side of the auxiliary electrode pattern away from the base substrate and having a first via hole penetrating through the organic material layer, a bottom of the first via hole exposing part of a surface of the auxiliary electrode pattern, wherein the part of the surface of the auxiliary electrode pattern exposed at the bottom of the first via hole is a non-planar surface; and a first electrode layer disposed on a side of the organic material layer away from the base substrate and electrically connected with the auxiliary electrode pattern through the first via hole.

In some embodiments, the auxiliary electrode pattern includes a first convex surface protruding in a first direction, and part of the first convex surface is exposed at the bottom of the first via hole, wherein the first direction is a direction perpendicular to a plane where the base substrate is located and facing a light-exiting side of the light-emitting substrate.

In some embodiments, the first convex surface is a truncated spherical surface.

In some embodiments, the light-emitting substrate further includes:

a first conductive pattern disposed between the auxiliary electrode pattern and the first power supply line and electrically connected with the first power supply line through a via hole; and a planarization layer disposed between the first conductive pattern and the first electrode layer and having a groove in a surface of a side of the planarization layer away from the base substrate, wherein the auxiliary electrode pattern is at least partially disposed in the groove and is electrically connected with the first conductive pattern through a second via hole penetrating through the planarization layer.

In some embodiments, a bottom of the groove includes a second convex surface protruding in the first direction, and an orthographic projection of the second convex surface on the base substrate at least partially overlaps with an orthographic projection of the first convex surface on the base substrate.

In some embodiments, the second convex surface is conformal to the first convex surface.

In some embodiments, in the first direction, a distance from a top of the second convex surface to a plane where the lowest position of a groove bottom of the groove is located is defined as H1, a height from a groove opening plane of the groove to the plane where the lowest position of the groove bottom of the groove is located is defined as H2, a thickness of the auxiliary electrode pattern at a position corresponding to a top of the second convex surface is defined as T, and H1, H2 and T satisfy: $H2 < H1 + T \leq 2*H2$.

In some embodiments, H1, H2 and T satisfy: $H2 < H1 + T \leq 1.5*H2$.

In some embodiments, in a second direction, the maximum length of the second convex surface is defined as L1, the minimum distance between the second convex surface and the second via hole is defined as L2, and L1 and L2 satisfy: $0.5*L1 \leq L2 \leq L1$, wherein the second direction is a direction parallel to the plane where the base substrate is located and pointing to a center of the second via hole from a center of the second convex surface.

In some embodiments, in a second direction, the maximum length of the second convex surface is defined as L1, the maximum length of the first via hole is defined as L3, and L1 and L3 satisfy: $0.25*L1 \leq L3 \leq L1$, wherein the second direction is a direction parallel to the plane where the base substrate is located and pointing from a center of the second convex surface to a center of the second via hole.

In some embodiments, a slope angle of the second convex surface at a bottom edge position is defined as $\theta$, and $\theta$ satisfies: $20° \leq \theta \leq 45°$.

In some embodiments, the light-emitting substrate further includes:

a pixel definition layer located on a side of the planarization layer away from the base substrate and having a first opening, wherein at least part of the organic material layer is located in the first opening, the first electrode layer is disposed on a surface of a side of the pixel definition layer away from the base substrate, and at least covers the organic material layer and a side wall of the first opening, a slope angle of the pixel definition layer at a bottom edge position of the first opening is defined as α, and a satisfies: 20°≤α≤30°.

In some embodiments, the light-emitting substrate further includes:

a pixel unit including a thin film transistor and a light-emitting device, wherein the light-emitting device includes a first electrode, a light-emitting layer and a second electrode layer, the thin film transistor is located between the base substrate and the planarization layer, the first electrode is located on a side of the planarization layer away from the base substrate, and is electrically connected with the thin film transistor through a third via hole penetrating through the planarization layer, at least part of the light-emitting layer is located on a surface of a side of the first electrode away from the base substrate, the second electrode layer is located on a side of the light-emitting layer away from the base substrate, the pixel definition layer also has a second opening, at least part of the light-emitting layer is located in the second opening, and the second electrode layer is disposed on the surface of a side of the pixel definition layer away from the base substrate and at least covers the light-emitting layer and a side wall of the second opening.

In some embodiments, a slope angle of the pixel definition layer at a bottom edge position of the second opening is defined as β, and α and β satisfy: α<β.

In some embodiments, the first electrode and the auxiliary electrode pattern are located in a same layer and made of a same material, the light-emitting layer and the organic material layer are located in a same layer and made of a same material, and the second electrode layer and the first electrode layer are located in a same layer and made of a same material.

In some embodiments, the light-emitting substrate further includes:

a first insulating layer, a second insulating layer, a third insulating layer and a fourth insulating layer which are sequentially laminated on the base substrate;

a second power supply line disposed on the base substrate; and a second conductive pattern disposed on a side of the third insulating layer away from the base substrate, and electrically connected with the second power supply line through a via hole penetrating through the third insulating layer, the second insulating layer and part of the first insulating layer, wherein the first insulating layer covers the first power supply line and the second power supply line, the fourth insulating layer covers the first conductive pattern and the second conductive pattern, and the second conductive pattern is electrically connected with the thin film transistor.

In some embodiments, the thin film transistor includes a gate electrode, an active layer, a source electrode and a drain electrode, the active layer is disposed on a surface of a side of the first insulating layer away from the base substrate, the source electrode and the drain electrode are disposed on a surface of a side of the third insulating layer away from the base substrate, and are electrically connected with the active layer through via holes penetrating through the third insulating layer and part of the second insulating layer respectively, and the gate electrode insulating layer covers the active layer, and the gate electrode is disposed on a surface of a side of the second insulating layer away from the base substrate.

In one aspect of the present disclosure, a display panel is provided and includes:

the aforementioned light-emitting substrate, a driving Integrated Circuit and a power supply circuit.

In some embodiments, the display panel further includes:

a color conversion substrate, located on a light-exiting side of the light-emitting substrate.

In one aspect of the present disclosure, a display device is provided and includes the aforementioned display panel.

BRIEF DESCRIPTION OF THE DRAWINGS

The accompanying drawings, which form part of the description, illustrate embodiments of the present disclosure and together with the description, serve to explain the principles of the present disclosure.

The present disclosure can be more clearly understood from the following detailed descriptions with reference to the accompanying drawings, in which:

FIG. 12 is a schematic diagram of a manufacturing process of an embodiment of the light-emitting substrate of the present disclosure;

FIG. 14A-FIG. 14H are schematic diagrams of part of processes of a manufacturing process example of an embodiment of the light-emitting substrate of the present disclosure respectively.

Figure 1:
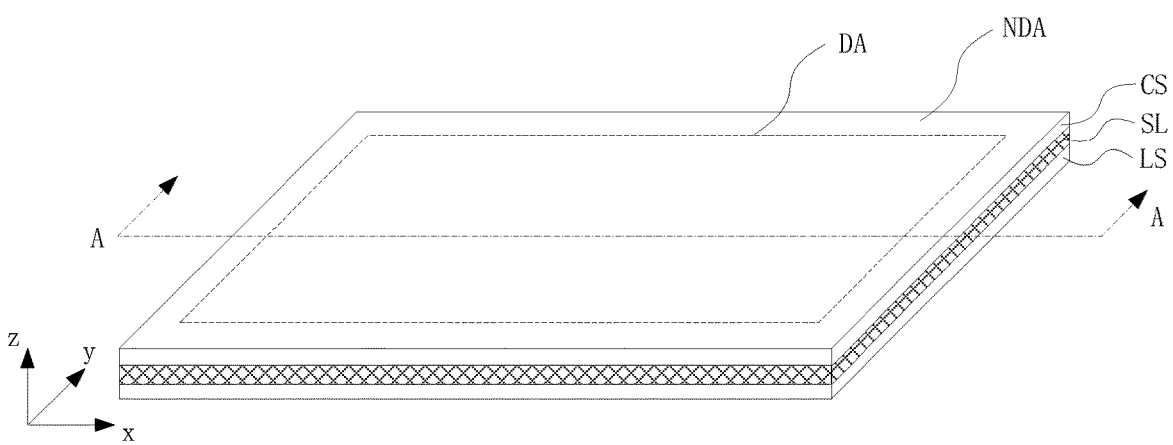
FIG. 1 is a schematic diagram of a stereoscopic structure of an embodiment of a display panel of the present disclosure.

It should be understood that the dimensions of various parts shown in the accompanying drawings are not drawn according to an actual scale relationship. In addition, the same or similar reference signs indicate the same or similar components.

DETAILED DESCRIPTION

Various exemplary embodiments of the present disclosure will now be described in detail with reference to the accompanying drawings. The descriptions of the exemplary embodiments are merely illustrative and are in no way intended to limit the present disclosure, and application or uses thereof. The present disclosure can be implemented in many different forms and is not limited to the embodiments described herein. These embodiments are provided, so that the present disclosure will be thorough and complete, and will fully convey the scope of the present disclosure to those skilled in the art. It should be noted that unless otherwise specified, the relative arrangement of components and steps, the composition of materials, numerical expressions and numerical values set forth in these embodiments should be interpreted as merely illustrative and not as limitative.

Similar words of "first", "second" and the like used in the present disclosure do not indicate any order, quantity or importance, but are only used to distinguish different parts. Similar words such as "include" or "comprise" mean that the elements before the word cover the elements listed after the word, without excluding the possibility of covering other elements. "Upper", "lower", "left", "right" and the like are only used to indicate a relative positional relationship. After the absolute position of a described object changes, the relative positional relationship may also change accordingly.

In the present disclosure, when it is described that a specific device is located between a first device and a second device, there may be an intervening device between the specific device and the first device or the second device, or not be an intervening device between the specific device and the first device. When it is described that the specific device is connected to other devices, the specific device may be directly connected to the other devices without the intervening device, and may also have the intervening device without being directly connected to the other devices.

All terms (including technical terms or scientific terms) used in the present disclosure have the same meanings as those understood by ordinary skilled in the art to which the present disclosure belongs, unless otherwise defined particularly. It should also be understood that the terms defined in, for example, general dictionaries should be interpreted as having the meanings consistent with their meanings in the context of the related art, and should not be interpreted in an idealized or extremely formal sense unless explicitly defined herein.

Technologies, methods and equipment known to those skilled in the related art may not be discussed in detail, but the technologies, methods and equipment should be regarded as part of the description under appropriate circumstances.

Figure 2:
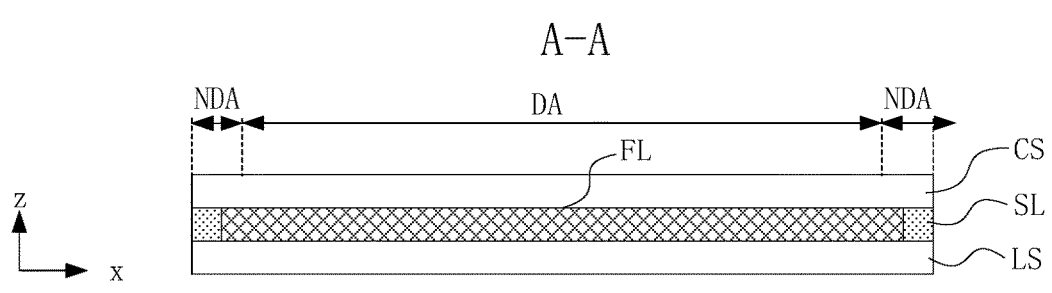
FIG. 2 is a schematic diagram of an AA section in FIG. 1.

FIG. 1 is a schematic diagram of a stereoscopic structure of an embodiment of a display panel of the present disclosure. FIG. 2 is a schematic diagram of an AA section in FIG. 1. As shown in FIG. 1 and FIG. 2, the display panel DP includes a light-emitting substrate LS and a color conversion substrate CS. The display panel may further include a driving integrated circuit (IC) and a power supply circuit. The display panel DP includes a display region DA for displaying images and a non-display region NDA where no image is displayed, and the non-display region NDA surrounds the outside of the display region DA. In some embodiments, the non-display region NDA may enclose the display region DA and may be located outside the display region DA in at least one direction. The display panel DP may further include a filling layer FL filling a space between the light-emitting substrate LS and the color conversion substrate CS, and a sealing layer SL for sealing the space between the light-emitting substrate LS and the color conversion substrate CS.

In FIG. 1 and FIG. 2, a first direction may be defined as a direction perpendicular to the plane where a base substrate of the light-emitting substrate is located and facing a light-exiting side of the light-emitting substrate, for example, the z direction in FIG. 1 and FIG. 2. A second direction and a third direction (for example, the x direction and the y direction in FIG. 1) are perpendicular to each other, and are both perpendicular to the plane where the base substrate of the light-emitting substrate is located. In the first direction z, the color conversion substrate CS may be disposed opposite to the light-emitting substrate LS. The color conversion substrate CS may include a color conversion pattern for converting the color of incident light. The color conversion pattern may include at least one of a color filter and a wavelength conversion pattern.

The sealing layer SL may be located between the light-emitting substrate LS and the color conversion substrate CS and in the non-display region NDA. The color conversion substrate CS may be disposed along edges of the light-emitting substrate LS and the color conversion substrate CS in the non-display region NDA to surround or be located at the periphery of the display region DA in a plan view. The sealing layer SL may be made of an organic material, such as an epoxy resin, but not limited thereto in the present disclosure.

The filling layer FL may be located in and filled the space, surrounded by the sealing layer SL, between the light-emitting substrate LS and the color conversion substrate CS. The filler FL may be made of a material capable of transmitting light. The filling layer FL may be made of an organic material, such as a silicon-based organic material or an epoxy-based organic material, but not limited thereto. In some embodiments, the filling layer FL may be omitted.

Figure 3:
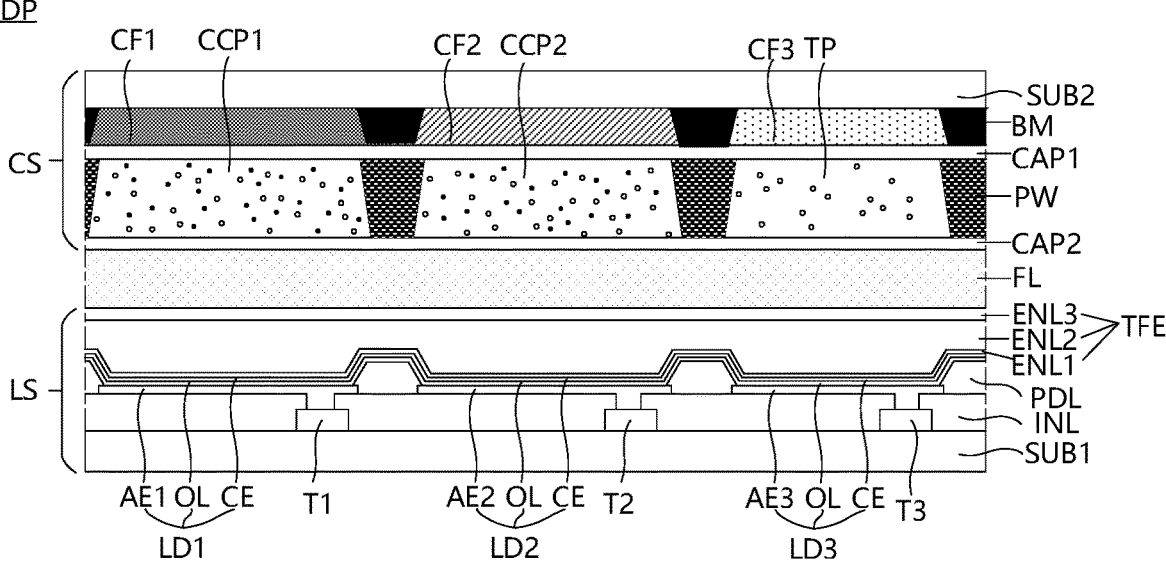
FIG. 3 is a schematic cross-sectional diagram of a display region in an embodiment of the display panel of the present disclosure.
Figure 4:
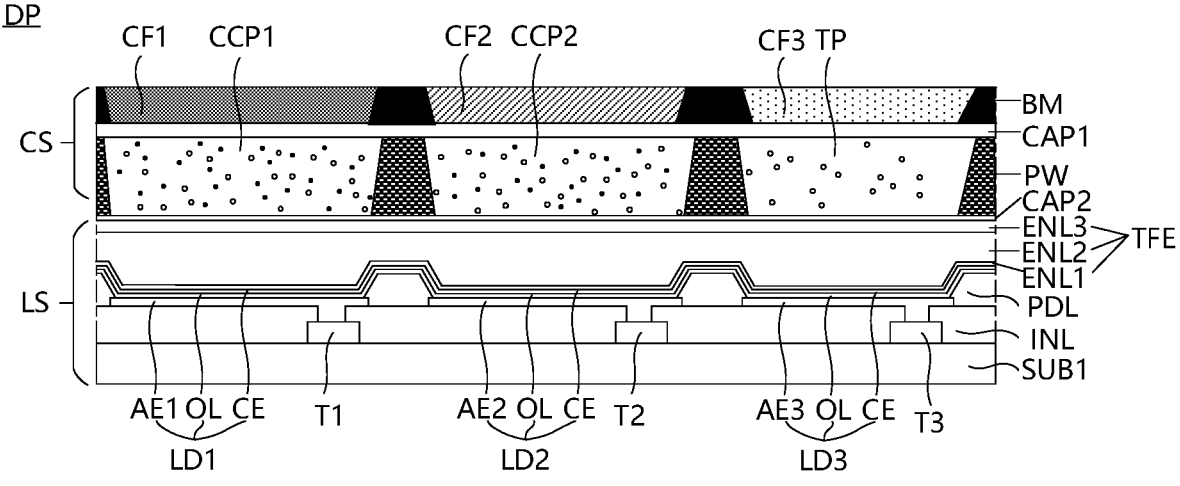
FIG. 4 is a schematic cross-sectional diagram of a display region in another embodiment of the display panel of the present disclosure.

FIG. 3 is a schematic cross-sectional diagram of a display region in an embodiment of the display panel of the present disclosure. FIG. 4 is a schematic cross-sectional diagram of a display region in another embodiment of the display panel of the present disclosure. Referring to FIG. 3, the display panel may be obtained in a cell assembling way, that is, the light-emitting substrate LS and the color conversion substrate CS are manufactured respectively, and then the light-emitting substrate LS and the color conversion substrate CS are bonded through the filling layer FL.

In FIG. 3, the light-emitting substrate LS may be an OLED backplate. The light-emitting substrate LS may include a first base substrate SUB1, an insulating structure INL, a pixel definition layer PDL, a thin film packaging structure TFE (for example, packaging layers ENL1, ENL2 and ENL3 which are disposed in a laminated way), a plurality of light-emitting devices (for example, LD1, LD2 and LD3) and corresponding transistors (for example, T1, T2 and T3). The light-emitting devices may include a plurality of light-emitting diodes, such as blue light-emitting diodes, or dichromatic light-emitting diodes, such as light-emitting diodes with blue and green light-emitting layers, or white light-emitting diodes, such as light-emitting diodes with a plurality of light-emitting layers of different colors which emit white light after being combined.

The light-emitting devices LD1, LD2 and LD3 may correspond to three sub-pixels in a pixel unit, wherein the light-emitting device LD1 may include an anode AE1, a light-emitting layer OL and a cathode CE, the light-emitting device LD2 may include an anode AE2, a light-emitting layer OL and a cathode CE, and the light-emitting device LD3 may include an anode AE3, a light-emitting layer OL and a cathode CE. The anodes AE1, AE2 and AE3 are electrically connected to the transistors T1, T2 and T3 respectively.

The color conversion substrate CS is disposed on the light-exiting side of the light-emitting substrate LS. In FIG. 3, the color conversion substrate CS may include a color conversion layer and a light-transmitting pattern TP which are located in a plurality of openings defined by partition walls PW. The color conversion layer includes a first color conversion pattern CCP1 and a second color conversion pattern CCP2. The color conversion substrate CS may include color filters CF1, CF2, and CF3 within a plurality of openings defined by light shielding patterns BM. The color conversion substrate CS further includes a second base substrate SUB2, a first cover plate CAP1 and a second cover plate CAP2. The partition walls PW, the color conversion layer and the light-transmitting pattern TP are located between the first cover plate CAP1 and the second cover plate CAP2, and the light shielding patterns BM and the color filters CF1, CF2 and CF3 are located between the second base substrate SUB2 and the first cover plate CAP1.

The first color conversion pattern CCP1 may emit light by converting or shifting a peak wavelength of the incident light to another specific peak wavelength. The first color conversion pattern CCP1 may convert the emitted light provided from the first light-emitting device LD1 into red light having a peak wavelength in the range of about 610 nm to about 650 nm. The first color conversion pattern CCP1 may include a first base resin and a first color conversion material dispersed in the first base resin, and may include first scattering particles dispersed in the first base resin. The second color conversion pattern CCP2 may emit light by converting or shifting the peak wavelength of the incident light to another specific peak wavelength. The second wavelength conversion pattern CCP2 may convert the emitted light provided from the second light-emitting element LD2 into green light having a peak wavelength in the range of about 510 nm to about 550 nm. The second color conversion pattern CCP2 may include a second base resin and a second color conversion material dispersed in the second base resin, and may include first scattering particles dispersed in the second base resin.

The first color conversion material and the second color conversion material may include semiconductor nanocrystals materials, and may emit light of a specific color under the condition that electrons transition from a conduction band to a valence band. Quantum dots may have any shape as long as the shape is commonly used in the art, and specifically may be spherical, conical, multi-armed or cubic nanoparticles, or may be nanotubes, nanowires, nanofibers or nanoparticles, etc.

In some other embodiments, the light-emitting substrate may also be a white OLED backplate including three-color sub-pixels, and a color filter layer CF is disposed on the light-exiting side thereof.

Referring to FIG. 4, a display panel may be formed in an ON-EL way, wherein the light-emitting substrate LS is basically the same as that in FIG. 3, the partition walls PW are made on the thin film packaging structure TFE of the light-emitting substrate LS, and then the color conversion layer and the light-transmitting pattern TP are printed in a plurality of openings defined by the partition walls PW. The color conversion substrate CS further includes the color filters CF1, CF2 and CF3 in a plurality of openings defined by the light shielding patterns BM, the first cover plate CAP1 and the second cover plate CAP2. The partition walls PW, the color conversion layer and the light-transmitting pattern TP are located between the first cover CAP1 and the second cover CAP2, and the light-shielding patterns BM and the color filters CF1, CF2 and CF3 are located on a side of the first cover CAP1 away from the light-emitting substrate LS.

Figure 5:
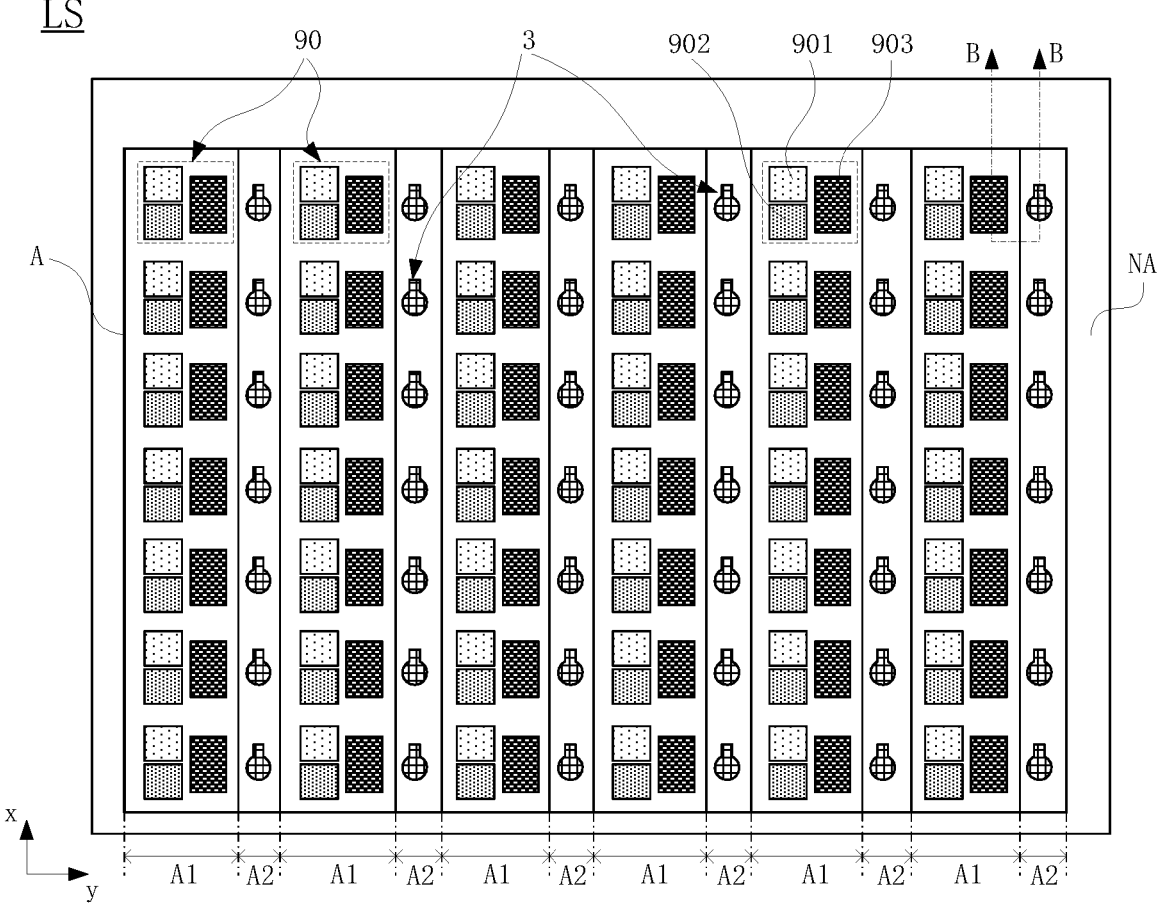
FIG. 5 is a schematic partition view of an embodiment of a light-emitting substrate of the present disclosure at a view angle perpendicular to the plane where the light-emitting substrate is located.

FIG. 5 is a schematic partition diagram of an embodiment of the light-emitting substrate of the present disclosure at a view angle perpendicular to the plane where the light-emitting substrate is located. Referring to FIG. 5, the light-emitting substrate LS may include a display region A and a non-display region NA surrounding the outside of the display region A at the view angle perpendicular to the plane where the light-emitting substrate is located (that is, the view angle in a thickness direction of the light-emitting substrate LS). For the display panel DP including the light-emitting substrate LS, the display region A of the light-emitting substrate LS may correspond to the display region DA of the display panel DP, and the non-display region NA of the light-emitting substrate LS may correspond to the non-display region NDA of the display panel DP. In FIG. 5, the light-emitting substrate LS includes a plurality of pixel regions A1 and a plurality of auxiliary electrode regions A2 in the display region A. The plurality of pixel regions A1 and auxiliary electrode regions A2 may be alternately arranged in the direction y.

In some embodiments, the light-emitting substrate may include a plurality of pixel units 90 in each pixel region A1. Each pixel unit 90 may include at least one sub-pixel, for example, a plurality of sub-pixels of one color, two colors or three colors. In one pixel region A1, the plurality of pixel units 90 may be sequentially arranged in the direction x.

In some embodiments, each pixel unit 90 includes a first sub-pixel 901, a second sub-pixel 902 and a third sub-pixel 903 of three different colors. For example, the first sub-pixel 901 is a blue sub-pixel, the second sub-pixel 902 is a green sub-pixel, and the third sub-pixel 903 is a red sub-pixel. In some other embodiments, each pixel unit 90 may further include a fourth sub-pixel, for example, the fourth sub-pixel is a white sub-pixel.

In some embodiments, the light-emitting substrate includes at least one auxiliary electrode pattern 3 in each auxiliary electrode region A2. Each pixel unit 90 may correspond to one auxiliary electrode pattern 3 or a plurality of auxiliary electrode patterns 3, or each auxiliary electrode pattern 3 may correspond to a plurality of pixel units 90. In some embodiments, in the plurality of auxiliary electrode regions A2, at least part of the auxiliary electrode patterns 3 in part of the auxiliary electrode regions A2 are subjected to laser ablation to be electrically connected with a cathode power supply line. In some embodiments, in the plurality of auxiliary electrode patterns 3 in one auxiliary electrode region, the plurality of auxiliary electrode patterns 3 may be arranged at intervals in the direction x, wherein at least part of the auxiliary electrode patterns 3 are subjected to laser ablation and are electrically connected with the cathode power supply line.

Figure 6:
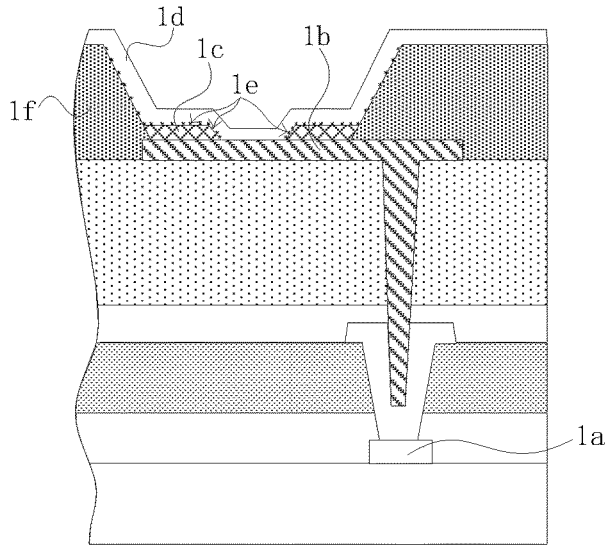
FIG. 6 is a schematic diagram of an auxiliary electrode region, in which particulate foreign matter is formed due to laser ablation of an electroluminescent material, of a light-emitting substrate in related art.

FIG. 6 is a schematic diagram of the auxiliary electrode region, in which particulate foreign matter is formed due to laser ablation of an electroluminescent material, of a light-emitting substrate in the related art. Referring to FIG. 6, in some light-emitting substrates of the related art, a cathode power supply line 1a is disposed in the display region of the light-emitting substrate, and electrical connection between the cathode power supply line 1a and a cathode material layer 1d is realized through an electrode pattern 1b (i.e., the auxiliary electrode pattern) located in the display region, so that a cathode signal (VSS) is connected to the cathode material layer 1d. In order to electrically connect the cathode material layer 1d with the cathode power supply line, the in related art, an organic electroluminescent (EL) material 1c is deposited on the surface of the electrode pattern 1b after the electrode pattern 1b is electrically connected with the cathode power supply line 1a, and then the EL material 1c is ablated by laser to expose the electrode pattern 1b, so as to subsequently partially deposit the cathode material layer 1d on the exposed electrode pattern 1b, thereby realizing that the cathode signal is directly connected to the cathode material layer 1d through in-plane overlapping.

It was found by the inventors that the laser ablation of the EL material 1c will produce particulate foreign matter 1e, and these particulate foreign matter 1e will be deposited on part of the regions of a pixel definition layer 1f, the EL material and the exposed electrode pattern 1b, which affects packaging reliability. At the same time, since an ablation region of the EL material is limited, contact area between the cathode material layer 1d and the anode material layer 1b is insufficient due to deposition of the particulate foreign matter, so that the cathode material layer 1d cannot form an effective overlapping with the anode material layer 1b, which leads to a higher voltage drop of the cathode signal, and affects displaying uniformity.

Since the laser ablation process inevitably produces particulate foreign matter, and a distribution range thereof is difficult to control, the packaging performance may be weakened in the region where the particulate foreign matter is aggregated. As a result, an inorganic packaging layer in the auxiliary electrode region cannot coat the part where the particulate foreign matter is located or the coating is not reliable, leading to a decrease of the resistant capability to water and oxygen intrusion and a decrease of the packaging reliability. In addition, since there is a segment difference in the opening of the pixel definition layer in the auxiliary electrode region, and the particulate foreign matter affects the packaging performance, the inorganic packaging layer at a segment difference position is thinner.

In view of this, the embodiment of the present disclosure provides a light-emitting substrate, which can realize effective overlapping in the auxiliary electrode regions.

Figure 7:
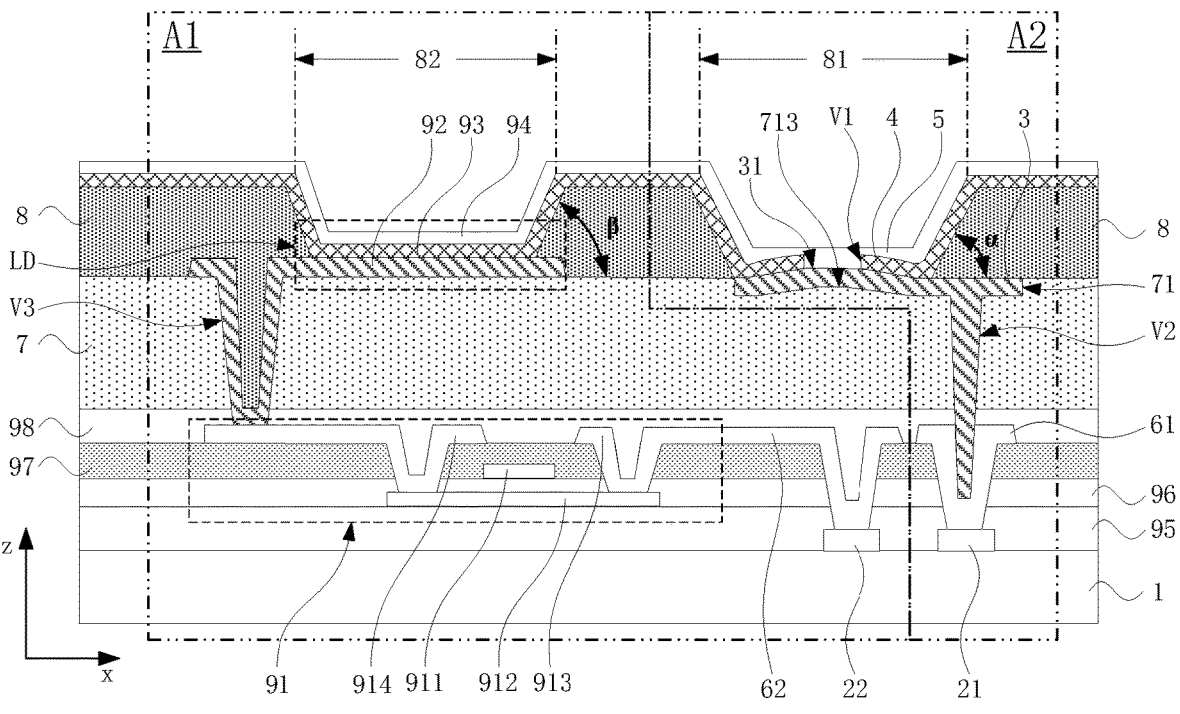
FIG. 7 is a schematic diagram of a BB section in FIG. 3.

FIG. 7 is a schematic diagram of a BB section in FIG. 3. FIG. 7 includes cross-sectional structures in the pixel region A1 and the auxiliary electrode region A2. Referring to FIG. 5 and FIG. 7, the light-emitting substrate LS according to the embodiment of the present disclosure includes a base substrate 1, a first power supply line 21, an auxiliary electrode pattern 3, an organic material layer 4 and a first electrode layer 5. The base substrate 1 may be made of a light-transmitting material (for example, inorganic glass, organic glass, a plastic substrate or other organic material substrates). The base substrate 1 may be rigid or flexible. The base substrate 1 may further include a buffer layer or an insulating layer to provide a substrate surface with better performance.

The light-emitting substrate LS includes not only the first power supply line 21, but also a second power supply line 22 located on the base substrate 1, and the second power supply line 22 and the first power supply line 21 are arranged at intervals. The first power supply line 21 and the second power supply line 22 may be signal lines formed by single-layer metal lines or stacked multi-layer metal lines, and have the same or different widths. Potentials of the first power supply line 21 and the second power supply line 22 are different. For example, the first power supply line 21 provides the cathode signal VSS, and the second power supply line 22 provides an anode signal VDD.

The light-emitting substrate LS may further include a first insulating layer 95 (for example, the buffer layer), a second insulating layer 96 (for example, a gate electrode insulating layer), a third insulating layer 97 (for example, an interlayer dielectric layer) and a fourth insulating layer 98 (for example, a passivation layer) which are laminated in sequence on the base substrate 1. The first insulating layer 95 covers the first power supply line 21 and the second power supply line 22.

The light-emitting substrate LS may further include a plurality of thin film transistors (TFTs) 91 located on the base substrate 1. The thin film transistor 91 may be a thin film transistor including polysilicon or an oxide semiconductor, and may have a top gate structure or a bottom gate structure. As shown in FIG. 7, in some embodiments, the thin film transistor 91 includes a gate electrode 911, an active layer 912, a source electrode 913 and a drain electrode 914. The active layer 912 is disposed on the surface of a side of the first insulating layer 95 away from the base substrate 1. The source electrode 913 and the drain electrode 914 are disposed on the surface of a side of the third insulating layer 97 away from the base substrate 1, and are electrically connected with the active layer 912 through via holes penetrating through the third insulating layer 97 and part of the second insulating layer 96 respectively. The second insulating layer 96 is disposed on the surface of a side of the first insulating layer 95 away from the base substrate 1, and covers the active layer 912. The gate electrode 911 is disposed on the surface of a side of the second insulating layer 96 away from the base substrate 1.

The light-emitting substrate LS may further include a first conductive pattern 61 and a second conductive pattern 62 which are located on a side of the third insulating layer 97 away from the base substrate 1. The first conductive pattern 61 is located between the auxiliary electrode pattern 3 and the first power supply line 21, and is electrically connected with the first power supply line 21 through a via hole penetrating through the third insulating layer 97, the second insulating layer 96 and part of the first insulating layer 95. The second conductive pattern 62 is electrically connected to the second power supply line 22 through a via hole penetrating through the third insulating layer 97, the second insulating layer 96 and part of the first insulating layer 95. The fourth insulating layer 98 covers the first conductive pattern 61 and the second conductive pattern 62, and the second conductive pattern 62 is electrically connected to the thin film transistor 91. In some embodiments, the first conductive pattern 61 and the second conductive pattern 62 may be made in the same layer as the source electrode 913 and the drain electrode 914 of the thin film transistor 91.

The light-emitting substrate LS may include a planarization layer 7 located on a side of the fourth insulating layer 98 away from the base substrate 1. The planarization layer 7 may provide a flat surface in the pixel region A1 and be formed by an organic layer. For example, the planarization layer 7 may include acrylic resin, epoxy resin, imide resin or ester resin, etc. The planarization layer 7 and part of the fourth insulating layer 98 may have a through third via hole V3, so as to expose the drain electrode 914 of the thin film transistor 91 and realize electrical connection. The planarization layer 7 and part of the fourth insulating layer 98 are provided with a through second via hole V2, so as to expose the first conductive pattern 61 and realize electrical connection.

The light-emitting substrate LS may include a plurality of light-emitting devices LD. The light-emitting device LD includes a first electrode 92, a light-emitting layer 93 and a second electrode layer 94. The first electrode 92 is located on a side of the planarization layer 7 away from the base substrate 1, and is electrically connected with the drain electrode 914 of the thin film transistor 91 through the third via hole V3. The light-emitting layer 93 is located on the surface of a side of the first electrode 92 away from the base substrate 1, and the second electrode layer 94 is located on a side of the light-emitting layer 93 away from the base substrate 1.

Referring to FIG. 7, in some embodiments, the plurality of light-emitting devices LD may share the light-emitting layer 93. The light-emitting layer 93 may also have the shape of a continuous film layer located in the pixel region A1 and the auxiliary electrode region A2. The light-emitting layer 93 includes an organic light-emitting layer, and may also include a plurality of other stacked auxiliary layers, such as a hole transport layer, an electron transport layer and a charge generation layer. The organic light-emitting layer may include a plurality of stacked layers, such as a first light-emitting layer and a second light-emitting layer. The first light-emitting layer and the second light-emitting layer may emit light of the same color, for example, both emit blue light. The first light-emitting layer and the second light-emitting layer may also emit the light of different colors, for example, the first light-emitting layer emits blue light and the second light-emitting layer emits green light.

The auxiliary electrode pattern 3 and the first electrode 92 may be made in the same layer. The auxiliary electrode pattern 3 is in contact with the first conductive pattern 61 through the second via hole V2 to realize electrical connection, thereby realizing electrical connection between the auxiliary electrode pattern 3 and the first power supply line 21 through the first conductive pattern 61.

Figure 8:
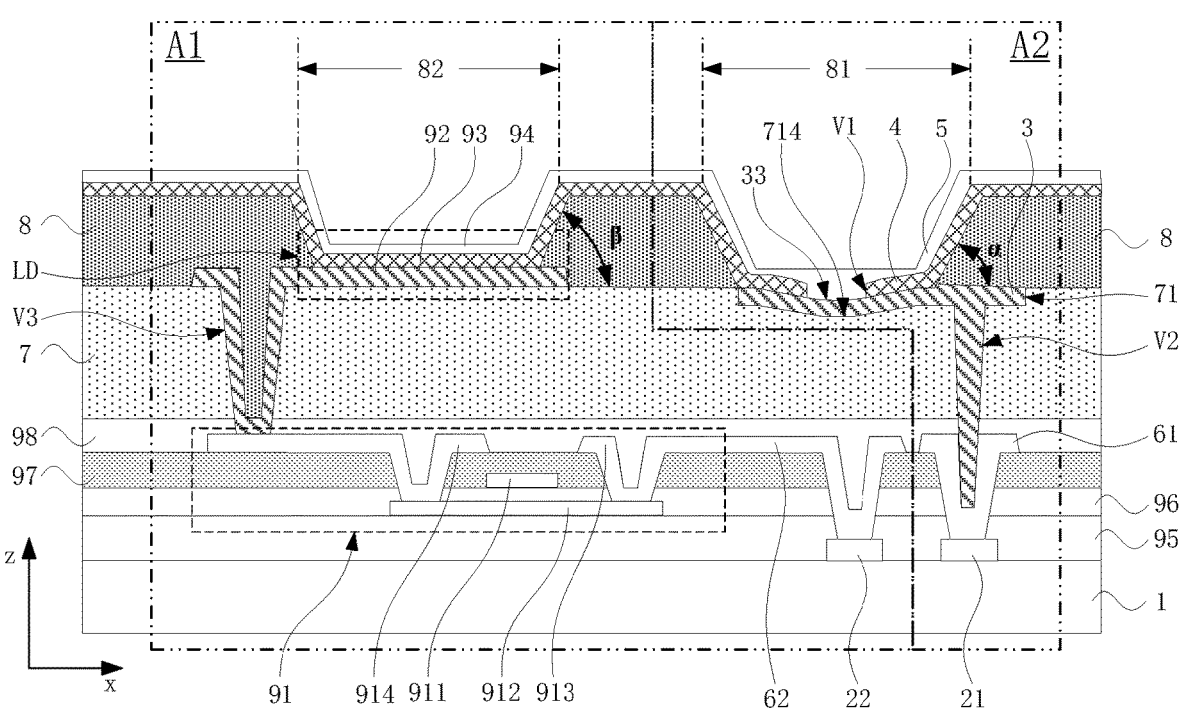
FIG. 8 is a schematic diagram of another example of the BB section in FIG. 3.

FIG. 8 is a schematic diagram of another example of the BB section in FIG. 3. Referring to FIG. 7 and FIG. 8, in some embodiments, the organic material layer 4 is disposed on the surface of a side of the auxiliary electrode pattern 3 away from the base substrate 1, and has a first via hole V1 penetrating through the organic material layer 4. Part of the surface of the auxiliary electrode pattern 3 is exposed at the bottom of the first via hole V1, wherein the part of the surface of the auxiliary electrode pattern 3 exposed at the bottom of the first via hole V1 is a non-planar surface, such as a concave surface, a convex surface or a curved surface. Compared with the flat surface, the non-planar surface has a larger surface area, which can increase an overlapping area between the first electrode layer 5 and the auxiliary electrode pattern 3, thereby effectively reducing a voltage drop of the cathode signal provided by the first power supply line 21.

Referring to FIG. 7, in some embodiments, the auxiliary electrode pattern 3 includes a first convex surface 31 protruding in a first direction, and part of the surface of the first convex surface 31 is exposed at the bottom of the first via hole V1, wherein the first direction is a direction perpendicular to the plane where the base substrate is located and facing the light-exiting side of the light-emitting substrate, for example, the z direction in FIG. 7. The first convex surface 31 can effectively reduce the aggregation of particulates on the auxiliary electrode pattern 3 after the EL material is ablated, thereby improving an overlapping quality between the first electrode layer 5 and the auxiliary electrode pattern 3. Referring to FIG. 8, in some other embodiments, the auxiliary electrode pattern 3 includes a first concave surface 33 recessed in a direction opposite to the first direction.

In the process of forming the first via hole V1 by means of laser ablation of the organic material layer, although the particulate foreign matter generated by ablation will be deposited on part of the surface area of the first convex surface 31, the first convex surface 31 with a larger surface area can still achieve a sufficient overlapping area between the first electrode layer 5 and the auxiliary electrode pattern 3 to ensure effective overlapping, thereby reducing a resistance from the first power supply line 21 to the first electrode layer 5 and further reducing the voltage drop of a power supply signal provided by the first power supply line 21.

In some embodiments, the power supply signal provided by the first power supply line 21 is the cathode signal (VSS). The first electrode layer 5 is overlapped with the auxiliary electrode pattern 3 through the first convex surface 31 exposed at the bottom of the first via hole V1, which can effectively reduce the voltage drop of the cathode signal provided by the first power supply line 21. In some other embodiments, the power supply signal provided by the first power supply line 21 is the anode signal (VDD). The first electrode layer 5 is overlapped with the auxiliary electrode pattern 3 through the first convex surface 31 exposed at the bottom of the first via hole V1, which can effectively reduce the voltage drop of the anode signal provided by the first power supply line 21.

In some embodiments, the first convex surface 31 may be a truncated spherical surface is cut by a plane, and such surface is relatively smooth, difficult to form an obvious segment difference, and easier to process and shape. The first convex surface may also be a frustum-shaped convex surface or a cone frustum-shaped convex surface. In some embodiments, the auxiliary electrode pattern 3 and the organic material layer 4 may be formed by mask evaporation, and the first electrode layer 5 may be formed by whole surface evaporation and continuous in the surface.

Figure 9:
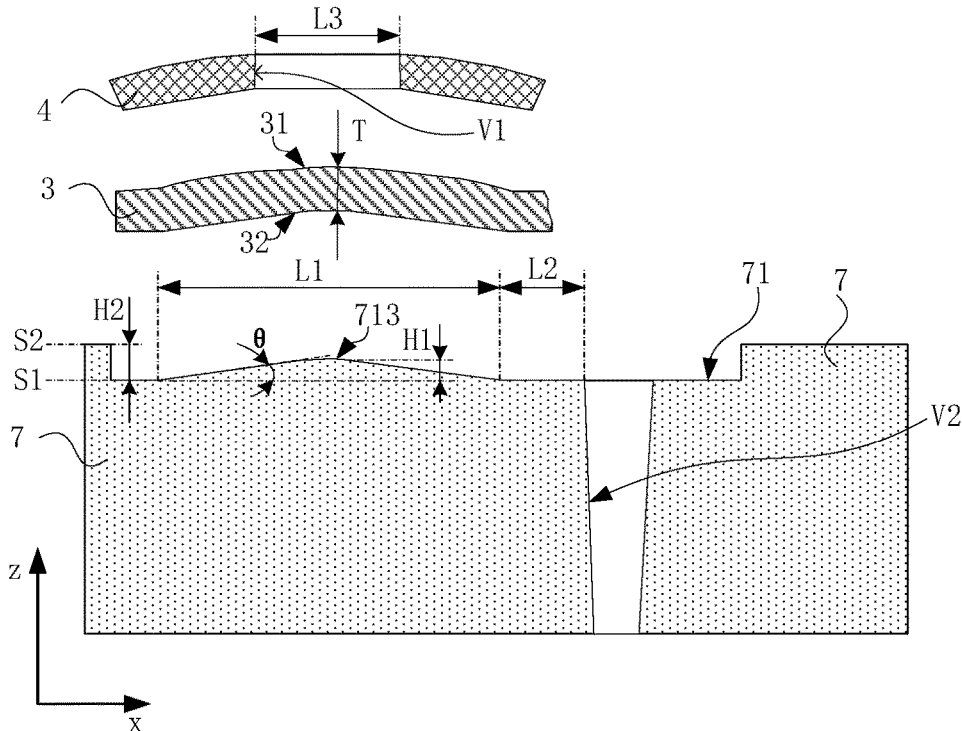
FIG. 9 is an exploded schematic diagram of a local structure of an auxiliary electrode region of an embodiment of the light-emitting substrate of the present disclosure.

FIG. 9 is an exploded schematic diagram of a local structure of an auxiliary electrode region of an embodiment of the light-emitting substrate of the present disclosure. Referring to FIG. 7 and FIG. 9, in some embodiments, the planarization layer 7 has a groove 71 in a surface on a side surface away from the base substrate 1. The auxiliary electrode pattern 3 is at least partially disposed in the groove 71, and is electrically connected with the first conductive pattern 61 through the second via hole V2 penetrating through the planarization layer 7. The groove 71 of the planarization layer 7 can reliably define the position and shape of the auxiliary electrode pattern 3. The first conductive pattern 61 can be electrically connected with the auxiliary electrode pattern 3 and the first power supply line 21 respectively, thereby realizing transmission of the power supply signal between the auxiliary electrode pattern 3 and the first power supply line 21.

In FIG. 7 and FIG. 9, the bottom of the groove 71 may include a second convex surface 713 protruding in the first direction (for example, the z direction). An orthographic projection of the second convex surface 713 on the base substrate 1 at least partially overlaps with an orthographic projection of the first convex surface 31 on the base substrate 1. The auxiliary electrode pattern 3 may form the first convex surface 31 on the auxiliary electrode pattern 3 by covering the surface of the second convex surface 713.

In FIG. 9, the surface of the auxiliary electrode pattern 3 in contact with the bottom of the groove 71 may have a second concave surface 32 recessed in the first direction. The second concave surface 32 may completely fit the second convex surface 713. For the auxiliary electrode pattern 3 having a thin film structure with a uniform thickness, the second convex surface 713 may be conformal to the first convex surface 31, that is, a surface morphology of the second convex surface 713 may be basically consistent with a surface morphology of the first convex surface 31, for example, both convex surfaces are frustum-shaped convex surfaces, cone frustum-shaped convex surfaces or spherical crown-shaped convex surfaces.

The light-emitting substrate may include a pixel definition layer (PDL) 8 which defines a pixel region A1 and an auxiliary electrode region A2. The pixel definition layer 8 is located on a side of the planarization layer 7 away from the base substrate 1, and may include a plurality of second openings 82 corresponding to the light-emitting devices LD and a first opening 81 corresponding to the auxiliary electrode pattern 3.

At least part of the organic material layer 4 is located in the first opening 81, and the first electrode layer 5 is disposed on the surface of a side of the pixel definition layer 8 away from the base substrate 1, and at least covers the organic material layer 4 and a side wall of the first opening 81.

In some embodiments, the organic material layer 4 may include the same film layer structure as the light-emitting layer 93. The organic material layer 4 includes an organic light-emitting layer, and may also include a plurality of other stacked auxiliary layers, such as a hole transport layer, an electron transport layer and a charge generation layer. The organic light-emitting layer may include a plurality of stacked layers, such as a first light-emitting layer and a second light-emitting layer. The first light-emitting layer and the second light-emitting layer may emit light of the same color, for example, both emit blue light. The first light-emitting layer and the second light-emitting layer may also emit light of different colors, for example, the first light-emitting layer emits blue light and the second light-emitting layer emits green light.

The slope angle of the pixel definition layer 8 at a bottom edge position of the first opening 81 is defined as α. The slope angle of a certain point on the curved surface refers to the included angle between a tangent plane at such point on the curved surface and the plane parallel to the base substrate 1. When the organic material layer 4 in the first opening 81 is subjected to a laser ablation process, particulate foreign matter will be generated, and the particulate foreign matter will be adhered to the side wall, bottom or top edge of the first opening. These positions belong to weak regions of packaging, and if the slope angle α is too large, it will be difficult for whole surface deposition of the packaging layer due to a larger segment difference and possible aggregation of the particulate foreign matter, leading to deterioration of the packaging performance.

If the slope angle α is too small, the size of the first opening 81 will increase, and if the slope angle α is too small, the unevenness of a slope wall surface of the first opening 81 may increase, possibly causing poor uniformity of respective openings in the pixel definition layer of the whole light-emitting substrate. Moreover, since a smaller slope angle requires a larger hole size, more space is occupied and the size of the auxiliary electrode region is affected. Therefore, in some embodiments, the slope angle α may satisfy: $20°≤α≤30°$, so that the segment difference can be reduced by setting the slope angle α in an appropriate range to compensate for an adverse impact of possible aggregation of the particulate foreign matter on the packaging performance.

Part of the light-emitting layer 93 is located in the second opening 82, and the second electrode layer 94 is disposed on the surface of a side of the pixel definition layer 8 away from the base substrate 1, and at least covers the light-emitting layer 93 and a side wall of the second opening 82. The slope angle of the pixel definition layer at a bottom edge position of the second opening 82 is defined as β. In some embodiments, the light-emitting layer 93 and the organic material layer 4 are formed by the same patterning process. Compared with the light-emitting layer 93, since the first via hole V1 is ablated from the organic material layer 4 by laser, the generated particulate foreign matter will cause the packaging performance of the region where the first opening 81 is located to be weaker than that of the region where the second opening 82 is located under the same packaging conditions. Therefore, α and β may satisfy: $α<β$, so that the segment difference can be reduced by adopting a smaller slope angle α to compensate for the adverse impact of possible aggregation of the particulate foreign matter on the packaging performance.

Referring to FIG. 7 and FIG. 8, in some embodiments, the first electrode 92 and the auxiliary electrode pattern 3 are located in the same layer and made of the same material, so that the first electrode 92 and the auxiliary electrode pattern 3 can be formed by the same patterning process, and processing procedures are simplified. In some embodiments, the light-emitting layer 93 and the organic material layer 4 are located in the same layer and made of the same material, so that the light-emitting layer 93 and the organic material layer 4 can be formed by the same patterning process, and the processing procedures are simplified. In some embodiments, the second electrode layer 94 and the first electrode layer 5 are located in the same layer and made of the same material, so that the second electrode layer 94 and the first electrode layer 5 can be formed by the same patterning process, and the processing procedures are simplified.

Figure 10:
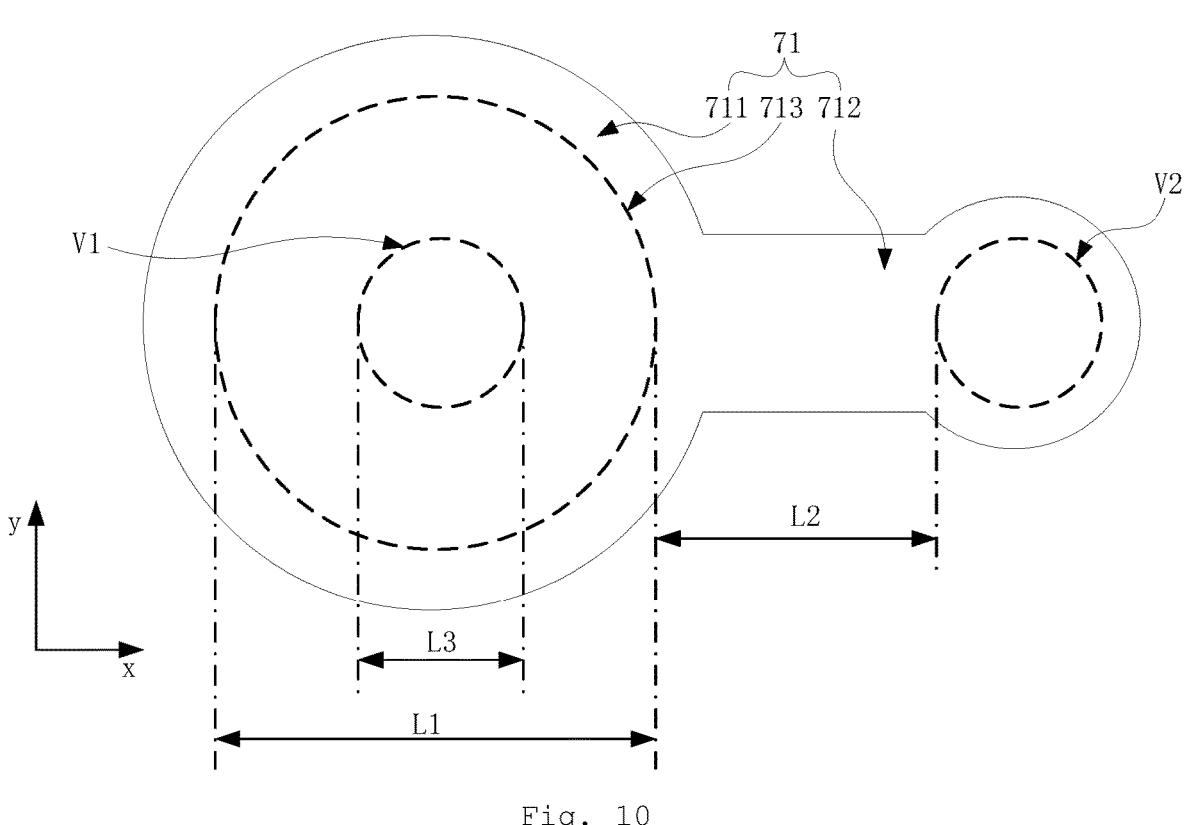
FIG. 10 is a schematic diagram of a dimensional relationship of a groove of a planarization layer of an embodiment of the light-emitting substrate of the present disclosure at a view angle perpendicular to the plane where the light-emitting substrate is located.
Figure 11:
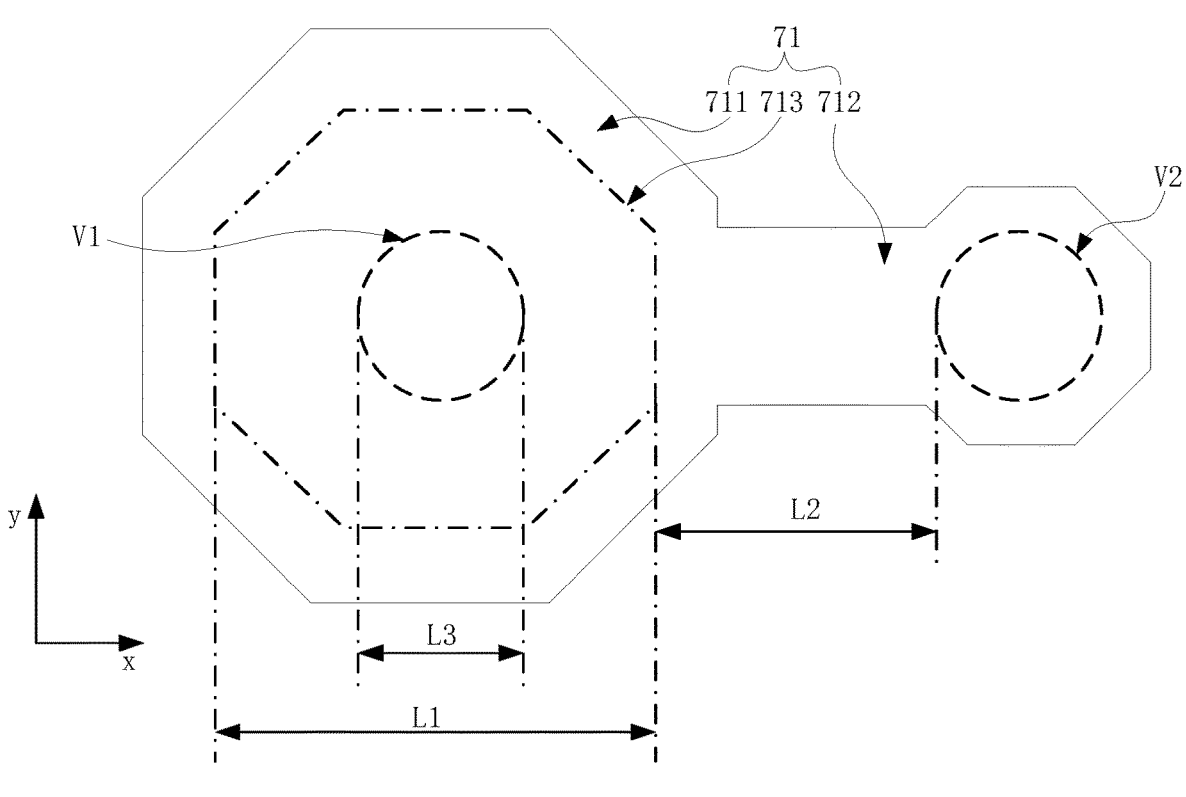
FIG. 11 is a schematic diagram of a dimensional relationship of a groove of a planarization layer of another embodiment of the light-emitting substrate of the present disclosure from the view angle perpendicular to the plane where the light-emitting substrate is located.

FIG. 10 is a schematic diagram of a dimensional relationship of the groove of the planarization layer of an embodiment of the light-emitting substrate of the present disclosure at the view angle perpendicular to the plane where the light-emitting substrate is located. FIG. 11 is a schematic diagram of the dimensional relationship of the groove of the planarization layer of another embodiment of the light-emitting substrate of the present disclosure at the view angle perpendicular to the plane where the light-emitting substrate is located.

Referring to FIG. 7 and FIG. 9-FIG. 11, the second direction may be defined as a direction (for example, the x direction) parallel to the plane where the base substrate is located 1 and pointing from a center of the second convex surface 713 to a center of the second via hole V2. Referring to FIG. 9-FIG. 11, in some embodiments, the groove 71 further includes a first part 711 surrounding the second convex surface 713, and a second part 712 connected with the first part 711 and provided with the second via hole V2.

Referring to FIG. 9, in some embodiments, the plane where the lowest position of the groove bottom of the groove 71 is located is defined as a first plane S1. The groove opening plane of the groove 71 is defined as a second plane S2. The first plane S1 and the second plane S2 are both parallel to the plane where the base substrate 1 is located.

In the first direction, the distance from the second convex surface 713 to the second plane S2 is defined as H1, the height from the first plane S1 to the second plane S2 is defined as H2, and the thickness of the position of the auxiliary electrode pattern 3 corresponding to the top of the second convex surface 713 is defined as T, wherein the relationship between H1, H2 and T satisfies: H2<H1+T≤2*H2.

The sum of H1 and T is the maximum distance between the auxiliary electrode pattern 3 and the first plane S1 in the first direction (for example, the z direction in FIG. 9). If the sum of H1 and T is too large, that is, the segment difference between the highest position and the lowest position at the bottom of the groove 71 is too large, the slope angle of the first convex surface 31 will increase and/or the occupied space of the auxiliary electrode pattern 3 at the plane position will increase. However, in the subsequent process, the thickness of the first electrode layer 5 is thinner, and the segment difference between the highest position and the lowest position at the bottom of the groove 71 is too large, which will lead to a fracture of the first electrode layer 5 and affect the electrical connection performance here. However, the occupied space of the auxiliary electrode pattern 3 on the plane increases, which will occupy the area of the pixel units and adversely affect a pixel arrangement density. At the same time, in the subsequent process, a first inorganic packaging layer in thin film packaging layers will be manufactured on the first electrode layer 5. If the segment difference here is too large, climbing of the first inorganic packaging layer may fail or there may be thin film defects, which affects the packaging performance.

Therefore, when the sum of H1 and T is greater than H2, the highest point of the first convex surface 31 (the position farthest away from the base substrate 1) protrudes from the second plane S2, which is convenient for the auxiliary electrode pattern 3 to form the first convex surface 31 when the auxiliary electrode pattern 3 is formed, and ensures effective overlapping between the auxiliary electrode pattern 3 and the first electrode layer 5. The sum of H1 and T is less than 2 times of H2, optionally less than 1.5 times of H2, so that the packaging performance of the region where the auxiliary electrode pattern is located can be improved and the occupied space of the auxiliary electrode pattern 3 on the light-emitting substrate is reduced.

Referring to FIG. 9, in some embodiments, the slope angle of the second convex surface 713 at a bottom edge position is defined as θ, wherein the slope angle of a certain point on the curved surface is the included angle between a tangent plane at that point on the curved surface and the plane parallel to the base substrate 1. The slope angle θ may reflect the segment difference formed by the second convex surface 713.

If θ is too large, the segment difference will increase, while the thickness of the organic material layer is usually thinner, and a too large slope angle or larger segment difference will easily cause a fracture of the organic material layer, which will affect the packaging performance here. If θ is too small, the slope of the auxiliary electrode pattern 3 formed thereon is relatively slow, and the thickness of the laminated auxiliary electrode pattern 3 is uneven when the process fluctuates. As a result, a substantial first convex surface 31 may be difficult to form on the auxiliary electrode pattern 3, resulting in an insufficient overlapping area and affecting effective overlapping. Therefore, in some embodiments, θ may satisfy: 20°≤θ≤45°, thereby ensuring the effective overlapping between the first electrode layer and the second electrode layer while ensuring the packaging performance of the corresponding region of the second convex surface. FIG. 10 shows the groove 71 of the planarization layer 7 at the view angle perpendicular to the plane where the light-emitting substrate is located. In FIG. 10, the circular region surrounded by the dashed line on the right side corresponds to the second via hole V2, the larger dashed box in the circular region surrounded by the two dashed lines on the right side corresponds to the bottom edge of the second convex surface 713, and the smaller dashed box corresponds to a projection of the first via hole V1 in the auxiliary electrode pattern 3 on the planarization layer 7. Referring to FIG. 10, cross-sectional shapes of the first via hole V1, the second via hole V2 and the second convex surface 713 may all be circular at the view angle perpendicular to the plane where the light-emitting substrate is located. The cross-sectional shape of the second convex surface 713 may also be other shapes, such as a polygon or an ellipse shown in FIG. 11. The center of the first via hole V1 may overlap with the center of the second convex surface 713 or not overlap with the center of the second convex surface 713.

Referring to FIG. 9 and FIG. 10, in some embodiments, in the second direction, the maximum length of the second convex surface 713 is defined as L1, and the minimum distance between the second convex surface 713 and the second via hole V2 is defined as L2. For the second convex surface 713 with a circular cross section, the maximum length L1 is a diameter of the largest area cross section of the second convex surface 713.

Orthographic projections of the groove 71 and the auxiliary electrode pattern 3 may basically overlap with each other at the view angle perpendicular to the plane where the light-emitting substrate is located. Accordingly, the ratio of L2 to L1 may reflect an area size relationship between the orthographic projection of the second convex surface 713 corresponding to the first convex surface 31 on the base substrate 1 and the orthographic projection of the auxiliary electrode pattern 3 on the base substrate 1. If the ratio of L2 to L1 is too large, then on the basis of ensuring that the second convex surface 713 has enough surface area to overlap with the auxiliary electrode pattern 3, the occupied space of the auxiliary electrode pattern 3 will increase, and the space of the pixel units is occupied, which is not conducive to increasing a pixel density of the light-emitting substrate. If the ratio of L2 to L1 is too small, then the second convex surface 713 is too close to the second via hole V2, which increases processing difficulty and leads to a decrease in yield. Therefore, in some embodiments, L1 and L2 may satisfy: 0.5*L1≤L2≤L1, thereby reducing the processing difficulty while the auxiliary electrode pattern occupies less space.

Referring to FIG. 9 and FIG. 10, in some embodiments, in the second direction, the maximum length of the second convex surface 713 is defined as L1, and the maximum length of the first via hole V1 is defined as L3. For the second convex surface 713 with a circular cross section, the maximum length L1 is a diameter of the largest area cross section of the second convex surface 713. For the first via hole V1 with a circular cross section, the maximum length L3 is a diameter of the largest area cross section of the first via hole V1. For the first via hole V1 formed by the laser ablation process, the maximum length L3 is a spot diameter of laser ablation.

The ratio of L3 to L1 may reflect the size occupied on the second convex surface 713 by the projection of the first via hole V1 on the planarization layer 7. If L3 exceeds L1, when the laser ablation process is adopted for the first via hole V1, not only a too long process time is caused, but also the film layers outside the auxiliary electrode region are ablated, causing a damage to other film layers. If the ratio of L3 to L1 is too small, then the part of the auxiliary electrode pattern 71 exposed by the first via hole V1 is too small, which causes a too small surface area for overlapping, and is difficult to form effective overlapping. Therefore, in some embodiments, L1 and L3 may satisfy: 0.25*L1≤L3≤L1, thereby reducing the process time and avoiding the damage to other film layers while ensuring a sufficient and effective overlapping area between the auxiliary electrode pattern 71 and the first electrode layer 5.

The light-emitting substrate according to above various embodiments of the present disclosure may be applied to a display panel. Therefore, the embodiment of the present disclosure also provides a display panel DP, including the light-emitting substrate LS according to any of the afore-mentioned embodiments. The display panel DP may further include a driving Integrated Circuit and a power supply circuit, wherein the driving Integrated Circuit is used for driving the pixel units of the light-emitting substrate LS, and the power supply circuit is used for supplying power to the driving Integrated Circuit and the light-emitting substrate LS. In some embodiments, the display panel DP may further include a color conversion substrate CS located on the light-exiting side of the light-emitting substrate LS.

The display panel according to above various embodi-ments of the present disclosure may be applied to various display devices, and may also be applied to other fields, such as lighting devices. Therefore, the embodiment of the pres-ent disclosure also provides a display device, including the light-emitting substrate according to any of the aforemen-tioned embodiments. The display device may be a mobile phone, a tablet computer, a television, a monitor, a notebook computer, a digital photo frame, a navigator and any other products or components with a display function.

FIG. 12 is a schematic diagram of a manufacturing process of an embodiment of the light-emitting substrate of the present disclosure. Referring to the light-emitting sub-strate according to the aforementioned embodiment of the present disclosure and FIG. 12, the manufacturing process of a light-emitting substrate includes steps S1 to S7.

In step S1, a base substrate 1 is provided, and a first power supply line 21, an insulating structure, a first conductive pattern 61 and a planarization layer 7 are sequentially formed on the base substrate 1, wherein the first conductive pattern 61 is electrically connected with the first power supply line 21 through a via hole penetrating through the insulating structure. Referring to FIG. 7, the insulating structure may include a first insulating layer 95 (for example, a buffer layer), a second insulating layer 96 (for example, a gate electrode insulating layer), a third insulating layer 97 (for example, an interlayer dielectric layer) and a fourth insulating layer 98 (for example, a passivation layer) which are sequentially laminated on the base substrate 1.

In step S2, a groove 71 and a second via hole V2 are formed in the surface of a side of the planarization layer 7 away from the base substrate 1, wherein the second via hole V2 is formed in the groove bottom surface of the groove 71, penetrates through the planarization layer 7 and part of the insulating structure, and exposes the first conductive pattern 61.

In step S3, an auxiliary electrode pattern 3 is formed in the region, at least including the groove 71, on the planarization layer 7, so that the auxiliary electrode pattern 3 covers the bottom of the groove 71 and is electrically connected with the first conductive pattern 61 through the second via hole V2, wherein the auxiliary electrode pattern 3 includes a first convex surface 31 protruding in a light-exiting direction of the light-emitting substrate.

In step S4, an organic material layer 4 is formed on the surface of a side of the auxiliary electrode pattern 3 away from the base substrate 1.

In step S5, the organic material layer 4 is subjected to laser ablation, so as to form a first via hole V1 in the organic material layer 4 penetrating through the organic material layer 4 and exposing the first convex surface 31.

In step S6, a first electrode layer 5 is formed on the surface of a side of the organic material layer 4 away from the base substrate 1, so that the first electrode layer 5 covers the organic material layer 4 and is electrically connected with the first convex surface 31 through the first via hole V1.

In the present embodiment, the first convex surface 31 formed in step S3 increases a surface area of the auxiliary electrode pattern 3 exposed by the first via hole V1 obtained by laser ablation of the organic material layer 4, so that when the first electrode layer 5 is overlapped with the auxiliary electrode pattern 3 through the first via hole V1, the over-lapping area is increased to ensure effective overlapping, thereby reducing a resistance from the first power supply line 21 to the first electrode layer 5 and further reducing the voltage drop of a power supply signal provided by the first power supply line 21.

In some embodiments, in step S2, the step of forming the groove 71 and the second via hole V2 in the surface of a side of the planarization layer 7 away from the base substrate 1 may specifically include: etching the groove 71 in the surface of a side of the planarization layer 7 away from the base substrate 1 through a half-tone mask, wherein the bottom of the groove 71 includes a second convex surface 713 protruding in a first direction and the second via hole V2.

The half-tone mask is a semi-transparent mask, and exposure thereof is less. By reducing light incidence during the exposure, the film layer can be etched with margin (that is, incompletely etched), thereby forming a gentler slope angle on the substrate, without completing etching of the substrate. By using the half-tone mask, the difficulty of forming the groove 71 with the second convex surface 713 in the surface of the planarization layer 7 can be reduced.

In some other embodiments, when the planarization layer 7 is formed, the surface of a side of the planarization layer 7 away from the base substrate 1 has a convex structure 73. Accordingly, in step S2, the step of forming the groove 71 and the second via hole V2 in the surface of a side of the planarization layer 7 away from the base substrate 1 may include: removing a material of the planarization layer 7 of the same thickness at the position corresponding to the groove 71 on the surface of a side of the planarization layer 7 away from the base substrate 1, so that the bottom of the groove 71 includes the second convex surface 713 protrud-ing in the first direction; and etching the second via hole V2 in the bottom of the groove 71. In step S3, the step of forming the auxiliary electrode pattern 3 in the region, at least including the groove 71, on the planarization layer 7 may include: evaporating a material of the auxiliary elec-trode pattern 3 in the region, at least including the groove 71, on the planarization layer 7, and forming the first convex surface 31 by the material of the auxiliary electrode pattern 3 covering the second convex surface 713.

Compared with the previous manufacturing method embodiment, the present embodiment can enable the surface to have the convex structure when the planarization layer is formed, and then material of the planarization layer of the same thickness is etched off, thereby forming a second convex structure in the groove. Then the second via hole is etched, so that the auxiliary electrode pattern is electrically connected with the first conductive pattern through the second via hole.

In various embodiments of the above manufacturing method, after the step of forming the auxiliary electrode pattern 3, the manufacturing method may further include: forming a pixel definition layer 8 on a side of the planarization layer 7 away from the base substrate 1 through a mask lithography process, wherein the pixel definition layer 8 has a first opening 81 for disposing the organic material layer 4 and second opening 82 for disposing the light-emitting layer 93 of pixel units 90, a slope angle of the pixel definition layer 8 at the bottom edge position of the first opening 81 is defined as α, a slope angle of the pixel definition layer 8 at the bottom edge position of the second opening 82 is defined as β, and α and β satisfy: α<β. In this way, the segment difference is reduced by using the smaller slope angle α to compensate for the adverse impact of possible aggregation of particulate foreign matter on the packaging performance.

Figure 13A:
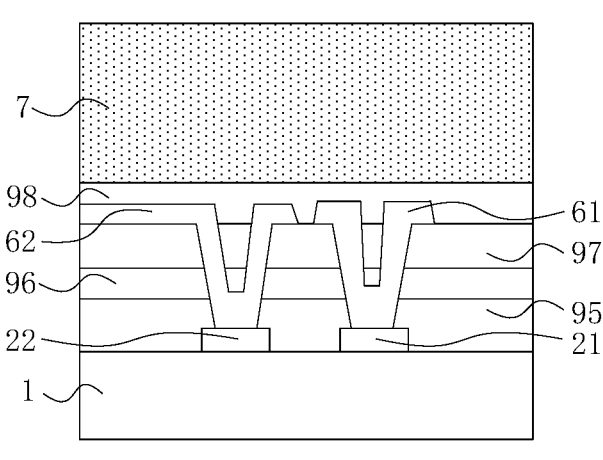
FIG. 13A-FIG. 13G are schematic diagrams of part of processes of a manufacturing process example of an embodiment of the light-emitting substrate of the present disclosure respectively.
Figure 13B:
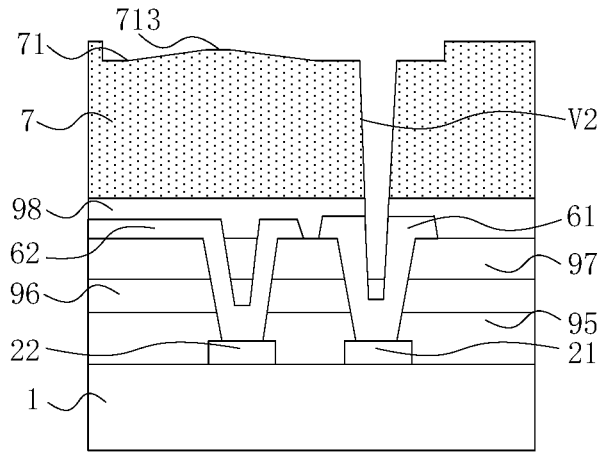
Figure 13C:
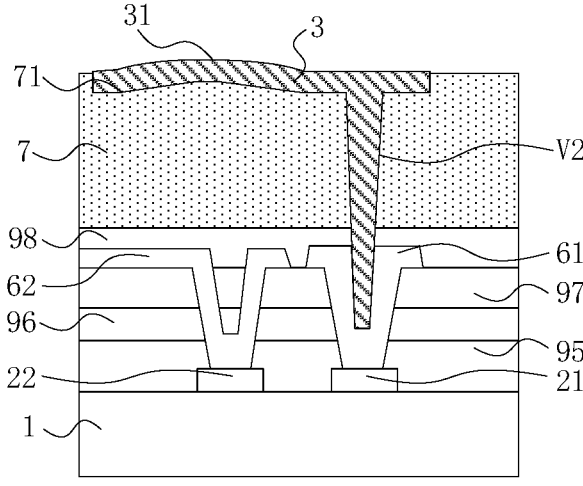
Figure 13D:
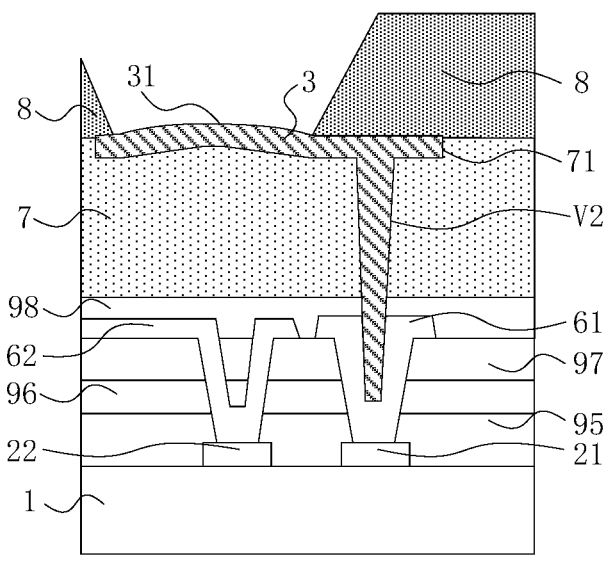
Figure 13E:
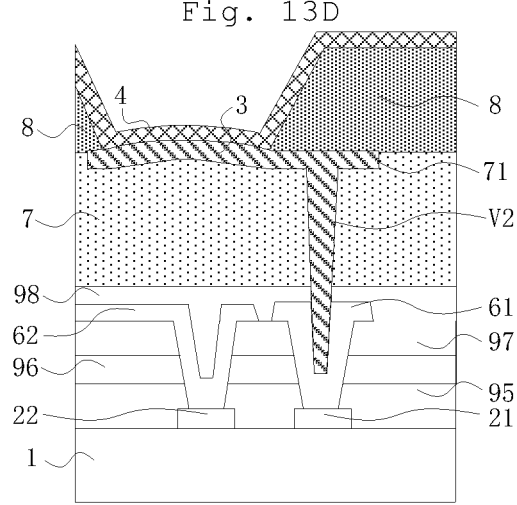
Figure 13F:
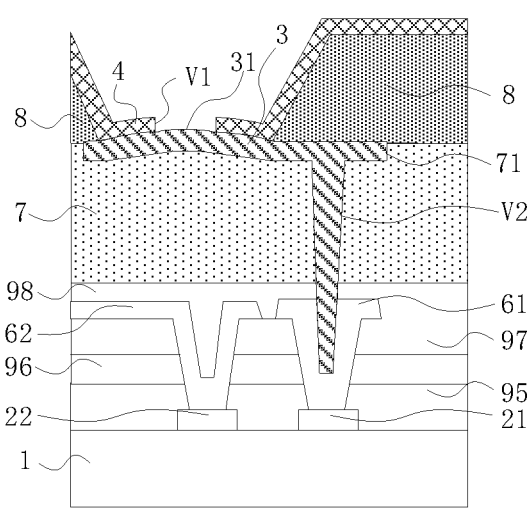
Figure 13G:
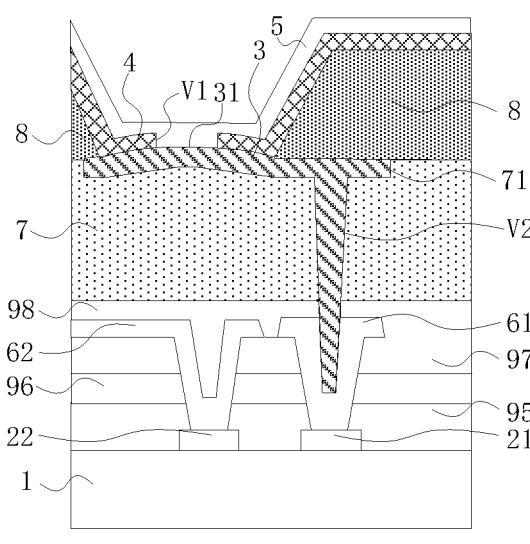

FIG. 13A-FIG. 13G are schematic diagrams of part of processes of a manufacturing process example of an embodiment of the light-emitting substrate of the present disclosure respectively. Referring to FIG. 13A-FIG. 13G, in some embodiments, part of processes of the manufacturing process example of the light-emitting substrate includes:

providing a base substrate 1, and sequentially forming a first power supply line 21, an insulating structure, a first conductive pattern 61 and a planarization layer 7 on the base substrate 1, wherein the first conductive pattern 61 is electrically connected with the first power supply line 21 through a via hole penetrating through the insulating structure, and the insulating structure may include a first insulating layer 95 (for example, a buffer layer), a second insulating layer 96 (for example, a gate electrode insulating layer), a third insulating layer 97 (for example, an interlayer dielectric layer) and a fourth insulating layer 98 (for example, a passivation layer) which are sequentially laminated on the base substrate 1, that is, the structure shown in FIG. 13A;

etching a groove 71 and a second via hole V2 in the surface of a side of the planarization layer 7 away from the base substrate 1 through a half-tone mask, wherein the bottom of the groove 71 includes a second convex surface 713 protruding in a first direction, thereby forming the structure shown in FIG. 13B;

evaporating an auxiliary electrode pattern 3 in the region, at least including the groove 71, on the planarization layer 7, so that the auxiliary electrode pattern 3 covers the bottom of the groove 71 and is electrically connected with the first conductive pattern 61 through the second via hole V2, wherein the auxiliary electrode pattern 3 includes a first convex surface 31 protruding in the first direction, thereby forming the structure shown in FIG. 13C;

forming a pixel definition layer 8 on a side of the planarization layer 7 away from the base substrate 1 through the half-tone mask, and enabling the pixel definition layer 8 to have a first opening for disposing the organic material layer 4, wherein the pixel definition layer 8 covers part of the auxiliary electrode pattern and exposes at least part of the first convex surface 31, thereby forming the structure shown in FIG. 13D;

evaporating the organic material layer 4 on the surface of the auxiliary electrode pattern in the first opening to form the structure shown in FIG. 13E;

performing laser ablation on the organic material layer 4, so as to form a first via hole V1 in the organic material layer 4 penetrating through the organic material layer 4 and exposing the first convex surface 31, thereby forming the structure shown in FIG. 13F; and evaporating a first electrode layer 5 on the surface of a side of the organic material layer 4 away from the base substrate 1, so that the first electrode layer 5 covers the organic material layer 4, the surface of the pixel definition layer 8, a side wall of the first opening, etc., and electrical connection between the first electrode layer 5 and the first convex surface 31 is realized by overlapping of the first electrode layer 5 and the first convex surface 31 through the first via hole V1, thereby forming the structure shown in FIG. 13G.

Subsequently, a packaging layer may be formed based on FIG. 13G to realize packaging of the light-emitting substrate. A quantum dot layer or a color filter may also be disposed in the first direction.

Figure 14A:
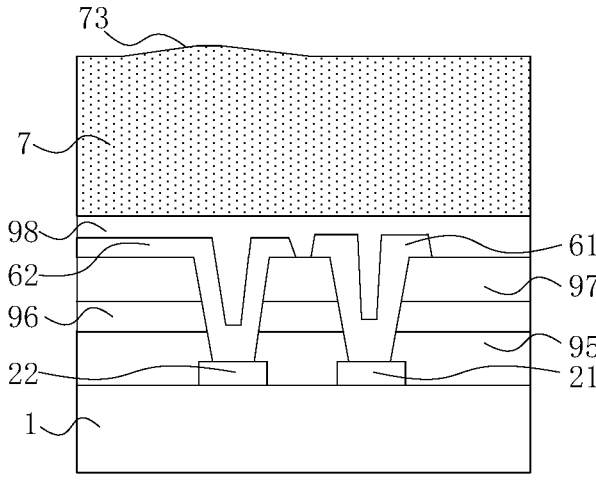
Figure 14B:
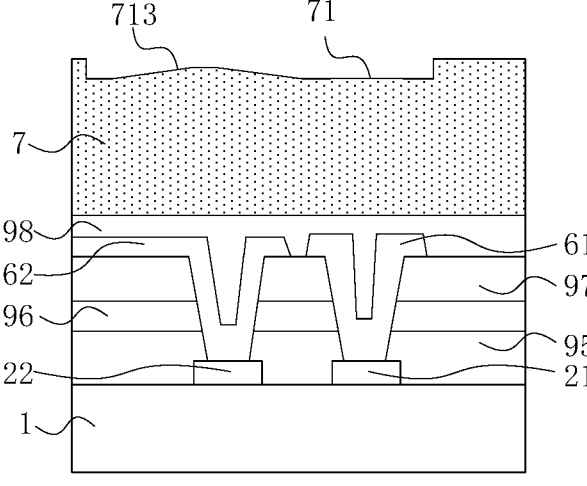
Figure 14C:
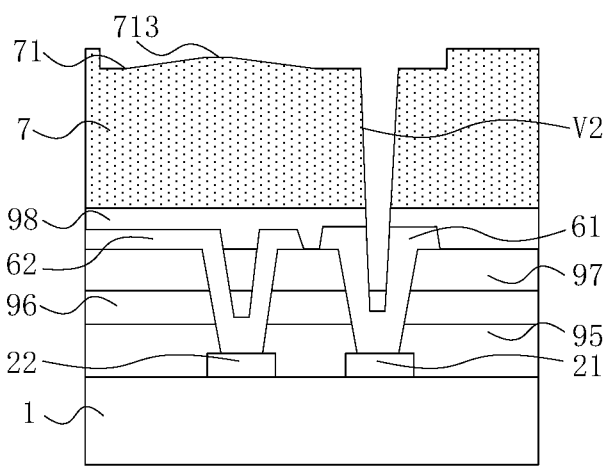
Figure 14D:
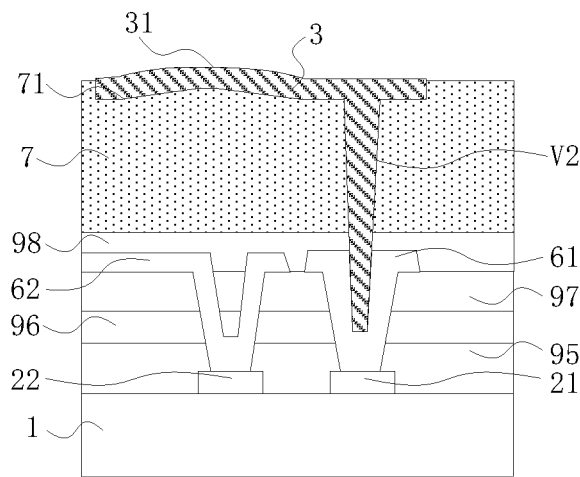
Figure 14E:
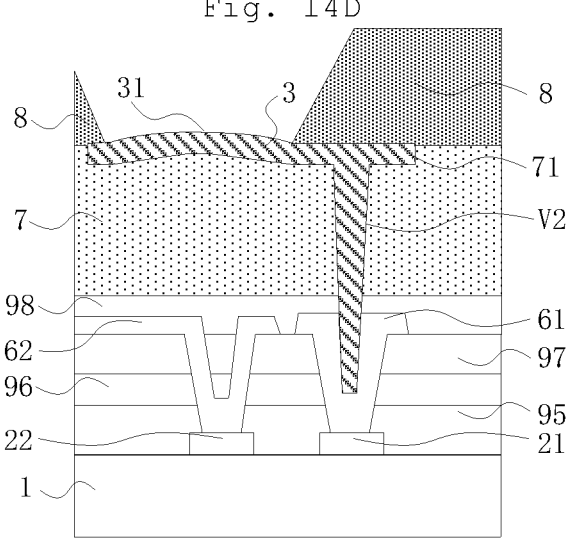
Figure 14F:
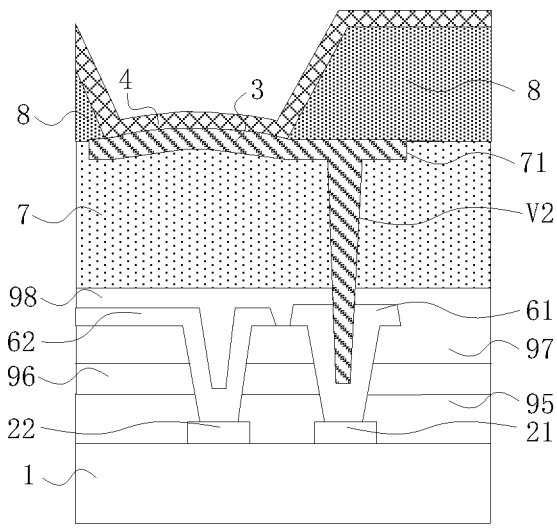
Figure 14C:
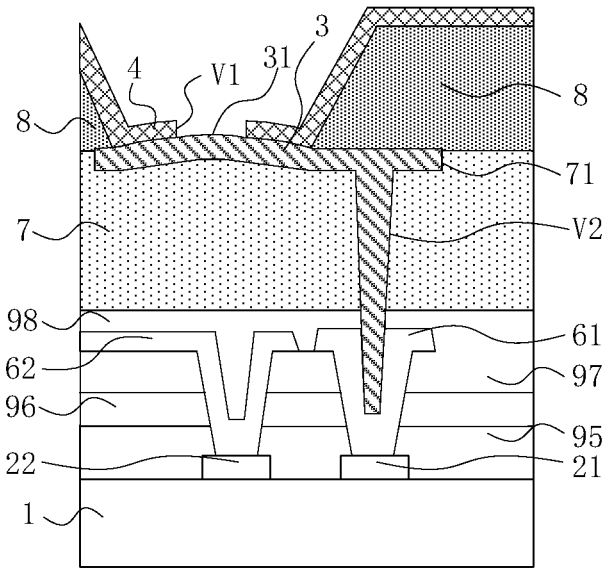
Figure 14H:
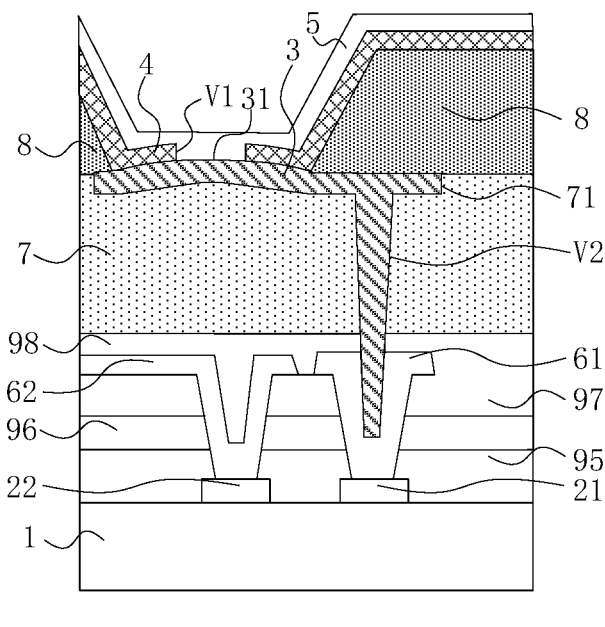

FIGS. 14A-14H are schematic diagrams of part of processes of a manufacturing process example of an embodiment of the light-emitting substrate of the present disclosure respectively. Referring to FIG. 14A-FIG. 14H, in some embodiments, part of processes of the manufacturing process example of the light-emitting substrate includes:

providing a base substrate 1, and sequentially forming a first power supply line 21, an insulating structure, a first conductive pattern 61 and a planarization layer 7 on the base substrate 1, wherein the surface of a side of the planarization layer 7 away from the base substrate 1 has a convex structure 73, the first conductive pattern 61 is electrically connected with the first power supply line 21 through a via hole penetrating through the insulating structure, and the insulating structure may include a first insulating layer 95 (for example, a buffer layer), a second insulating layer 96 (for example, a gate electrode insulating layer), a third insulating layer 97 (for example, an interlayer dielectric layer) and a fourth insulating layer 98 (for example, a passivation layer) which are sequentially laminated on the base substrate 1, that is, the structure shown in FIG. 14A;

removing a material of the planarization layer 7 of the same thickness at the position corresponding to the groove 71 in the surface of a side of the planarization layer 7 away from the base substrate 1, so that the bottom of the groove 71 includes a second convex surface 713 protruding in a first direction, thereby forming the structure shown in FIG. 14B;

etching a second via hole V2 in the bottom of the groove 71 to form the structure shown in FIG. 14C;

evaporating an auxiliary electrode pattern 3 in the region, at least including the groove 71, on the planarization layer 7, so that the auxiliary electrode pattern 3 covers the bottom of the groove 71 and is electrically connected with the first conductive pattern 61 through the second via hole V2, wherein the auxiliary electrode pattern 3 includes a first convex surface 31 protruding in the first direction, thereby forming the structure shown in FIG. 14D;

forming a pixel definition layer 8 on a side of the planarization layer 7 away from the base substrate 1 through a half-tone mask, and enabling the pixel definition layer 8 to have a first opening for disposing the organic material layer 4, wherein the pixel definition layer 8 covers part of the auxiliary electrode pattern and exposes at least part of the first convex surface 31, thereby forming the structure shown in FIG. 14E;

evaporating the organic material layer 4 on the surface of the auxiliary electrode pattern in the first opening to form the structure shown in FIG. 14F;

performing laser ablation on the organic material layer 4, so that a first via hole V1 penetrating through the organic material layer 4 and exposing the first convex surface 31 is formed in the organic material layer 4, thereby forming the structure shown in FIG. 14G; and evaporating a first electrode layer 5 on the surface of a side of the organic material layer 4 away from the base substrate 1, so that the first electrode layer 5 covers the organic material layer 4, the surface of the pixel definition layer 8, a side wall of the first opening, etc., and electrical connection between the first electrode layer 5 and the first convex surface 31 is realized by overlapping of the first electrode layer 5 and the first convex surface 31 through the first via hole V1, thereby forming the structure shown in FIG. 14H.

Subsequently, a packaging layer may be formed based on the structure shown in FIG. 14H to realize packaging of the light-emitting substrate. A quantum dot layer or a color filter may also be disposed in a light-exiting direction of the light-emitting substrate.

So far, various embodiments of the present disclosure have been described in detail. In order to avoid obscuring concepts of the present disclosure, some details that are well known in the art have not been described. Those skilled in the art can fully understand how to implement the technical solutions disclosed here according to the above descriptions.

Although some specific embodiments of the present disclosure have been described in detail through examples, it should be understood by those skilled in the art that the above examples are only for illustration and are not intended to limit the scope of the present disclosure. Those skilled in the art should understand that the above embodiments can be modified or some technical features can be replaced by equivalents without departing from the scope and spirit of the present disclosure. The scope of the present disclosure is defined by appended claims.

What is claimed is:

1. A light-emitting substrate, comprising:
a base substrate;
a first power supply line disposed on the base substrate;
an auxiliary electrode pattern disposed on a side of the first power supply line away from the base substrate and electrically connected with the first power supply line;
an organic material layer disposed on a surface of a side of the auxiliary electrode pattern away from the base substrate and having a first via hole penetrating through the organic material layer, a bottom of the first via hole exposing part of a surface of the auxiliary electrode pattern, wherein the part of the surface of the auxiliary electrode pattern exposed at the bottom of the first via hole is a non-planar surface; and
a first electrode layer disposed on a side of the organic material layer away from the base substrate and electrically connected with the auxiliary electrode pattern through the first via hole;
wherein the auxiliary electrode pattern comprises a first convex surface protruding in a first direction, and part of the first convex surface is exposed at the bottom of the first via hole, wherein the first direction is a direction perpendicular to a plane where the base substrate is located and facing a light-exiting side of the light-emitting substrate;

wherein the light-emitting substrate further comprises:
a first conductive pattern disposed between the auxiliary electrode pattern and the first power supply line and electrically connected with the first power supply line through a via hole; and
a planarization layer disposed between the first conductive pattern and the first electrode layer and having a groove in a surface of a side of the planarization layer away from the base substrate;
wherein a bottom of the groove comprises a second convex surface protruding in the first direction, and an orthographic projection of the second convex surface on the base substrate at least partially overlaps with an orthographic projection of the first convex surface on the base substrate.

2. The light-emitting substrate according to claim 1, wherein the first convex surface is a truncated spherical surface.

3. The light-emitting substrate according to claim 1, wherein the auxiliary electrode pattern is at least partially disposed in the groove and is electrically connected with the first conductive pattern through a second via hole penetrating through the planarization layer.

4. The light-emitting substrate according to claim 1, wherein the second convex surface is conformal to the first convex surface.

5. The light-emitting substrate according to claim 1, wherein in the first direction, a distance from a top of the second convex surface to a plane where the lowest position of a groove bottom of the groove is located is defined as H1, a height from a groove opening plane of the groove to the plane where the lowest position of the groove bottom of the groove is located is defined as H2, a thickness of the auxiliary electrode pattern at a position corresponding to a top of the second convex surface is defined as T, and H1, H2 and T satisfy: $H2<H1+T\leq2*H2$.

6. The light-emitting substrate according to claim 5, wherein H1, H2 and T satisfy: $H2<H1+T\leq1.5*H2$.

7. The light-emitting substrate according to claim 1, wherein in a second direction, the maximum length of the second convex surface is defined as L1, the minimum distance between the second convex surface and the second via hole is defined as L2, and L1 and L2 satisfy: $0.5*L1\leq L2\leq L1$, wherein the second direction is a direction parallel to the plane where the base substrate is located and pointing to a center of the second via hole from a center of the second convex surface.

8. The light-emitting substrate according to claim 1, wherein in a second direction, the maximum length of the second convex surface is defined as L1, the maximum length of the first via hole is defined as L3, and L1 and L3 satisfy: $0.25*L1\leq L3\leq L1$, wherein the second direction is a direction parallel to the plane where the base substrate is located and pointing from a center of the second convex surface to a center of the second via hole.

9. The light-emitting substrate according to claim 1, wherein a slope angle of the second convex surface at a bottom edge position is defined as θ, and θ satisfies: $20°\leq\theta\leq45°$.

10. The light-emitting substrate according to claim 1, further comprising:
a pixel definition layer located on a side of the planarization layer away from the base substrate and having a first opening,
wherein at least part of the organic material layer is located in the first opening, the first electrode layer is disposed on a surface of a side of the pixel definition layer away from the base substrate, and at least covers the organic material layer and a side wall of the first opening, a slope angle of the pixel definition layer at a bottom edge position of the first opening is defined as α, and α satisfies: $20° \leq \alpha < 30°$.

11. The light-emitting substrate according to claim 10, further comprising:

a pixel unit comprising a thin film transistor and a light-emitting device, wherein the light-emitting device comprises a first electrode, a light-emitting layer and a second electrode layer, the thin film transistor is located between the base substrate and the planarization layer, the first electrode is located on a side of the planarization layer away from the base substrate, and is electrically connected with the thin film transistor through a third via hole penetrating through the planarization layer, at least part of the light-emitting layer is located on a surface of a side of the first electrode away from the base substrate, the second electrode layer is located on a side of the light-emitting layer away from the base substrate, the pixel definition layer also has a second opening, at least part of the light-emitting layer is located in the second opening, and the second electrode layer is disposed on the surface of a side of the pixel definition layer away from the base substrate and at least covers the light-emitting layer and a side wall of the second opening.

12. The light-emitting substrate according to claim 11, wherein a slope angle of the pixel definition layer at a bottom edge position of the second opening is defined as β, and α and β satisfy: $\alpha < \beta$.

13. The light-emitting substrate according to claim 11, wherein the first electrode and the auxiliary electrode pattern are located in a same layer and made of a same material, the light-emitting layer and the organic material layer are located in a same layer and made of a same material, and the second electrode layer and the first electrode layer are located in a same layer and made of a same material.

14. The light-emitting substrate according to claim 11, further comprising:

a first insulating layer, a second insulating layer, a third insulating layer and a fourth insulating layer which are sequentially laminated on the base substrate;

a second power supply line disposed on the base substrate; and a second conductive pattern disposed on a side of the third insulating layer away from the base substrate, and electrically connected with the second power supply line through a via hole penetrating through the third insulating layer, the second insulating layer and part of the first insulating layer, wherein the first insulating layer covers the first power supply line and the second power supply line, the fourth insulating layer covers the first conductive pattern and the second conductive pattern, and the second conductive pattern is electrically connected with the thin film transistor.

15. The light-emitting substrate according to claim 14, wherein the thin film transistor comprises a gate electrode, an active layer, a source electrode and a drain electrode, the active layer is disposed on a surface of a side of the first insulating layer away from the base substrate, the source electrode and the drain electrode are disposed on a surface of a side of the third insulating layer away from the base substrate, and are electrically connected with the active layer through via holes penetrating through the third insulating layer and part of the second insulating layer respectively, and the gate electrode insulating layer covers the active layer, and the gate electrode is disposed on a surface of a side of the second insulating layer away from the base substrate.

16. A display panel, comprising:

the light-emitting substrate according to claim 1, a driving Integrated Circuit and a power supply circuit.

17. The display panel according to claim 16, further comprising:

a color conversion substrate, located on a light-exiting side of the light-emitting substrate.

18. A display device, comprising:

the display panel according to claim 16.

* * * * *